United States Patent
Belzer et al.

(10) Patent No.: US 11,438,014 B2
(45) Date of Patent: Sep. 6, 2022

(54) DEEP NEURAL NETWORK A POSTERIORI PROBABILITY DETECTORS AND MEDIA NOISE PREDICTORS FOR ONE- AND TWO-DIMENSIONAL MAGNETIC RECORDING

(71) Applicant: Washington State University, Pullman, WA (US)

(72) Inventors: Benjamin Joseph Belzer, Pullman, WA (US); Krishnamoorthy Sivakumar, Pullman, WA (US); Jinlu Shen, Pullman, WA (US); Ahmed Aboutaleb, Pullman, WA (US); Amirhossein Sayyafan, Pullman, WA (US)

(73) Assignee: WASHINGTON STATE UNIVERSITY, Pullman, WA (US)

(*) Notice: Subject to any disclaimer, the term of this patent is extended or adjusted under 35 U.S.C. 154(b) by 212 days.

(21) Appl. No.: 16/889,143

(22) Filed: Jun. 1, 2020

(65) Prior Publication Data
US 2020/0389188 A1    Dec. 10, 2020

Related U.S. Application Data

(60) Provisional application No. 62/855,644, filed on May 31, 2019.

(51) Int. Cl.
H04L 23/02 (2006.01)
H03M 13/25 (2006.01)
G06N 3/04 (2006.01)
H03M 13/11 (2006.01)

(52) U.S. Cl.
CPC ............ *H03M 13/255* (2013.01); *G06N 3/04* (2013.01); *H03M 13/1105* (2013.01)

(58) Field of Classification Search
CPC ..... H04L 27/38; H04L 27/34; H04L 27/2649; H04L 25/03165; H04L 27/01; H04L 25/0254; H04L 41/16; G06N 3/04; G06N 3/08; G06N 3/0445; H03M 13/1111; H03M 13/255
USPC .......................... 275/261; 375/261, 260, 267
See application file for complete search history.

(56) References Cited

U.S. PATENT DOCUMENTS

| 2009/0180571 A1* | 7/2009 | Song ............... H04L 1/0065 375/295 |
| 2011/0026601 A1* | 2/2011 | Mueller ......... H03M 13/395 375/240.24 |
| 2012/0093246 A1* | 4/2012 | Sezginer ......... H04L 25/0204 375/260 |
| 2022/0038313 A1* | 2/2022 | Gomony .......... H04L 27/2649 |

* cited by examiner

*Primary Examiner* — Khai Tran
(74) *Attorney, Agent, or Firm* — WC&F IP

(57) ABSTRACT

A deep neural network (DNN) media noise predictor configured for one-dimensional-magnetic (1DMR) recording or two-dimensional-magnetic (TDMR) is introduced. Such architectures are often combined with a trellis-based intersymbol interference (ISI) detection component in a turbo architecture to avoid the state explosion problem by separating the inter-symbol interference (ISI) detection and media noise estimation into two separate detectors and uses the turbo-principle to exchange information between them so as to address the modeling problem by way of training a DNN-based media noise estimators. Thus, beneficial aspects include a reduced bit-error rate (BER), an increased areal density, and a reduction in computational complexity and computational time.

23 Claims, 8 Drawing Sheets

| $L_8$ | $L_7$ | $L_6$ | $L_5$ | $L_4$ | $L_3$ | $L_2$ | $L_1$ | $L_0$ |

| $L_8$ | $L_7$ | $L_6$ | $u_2$ | $u_1$ | $u_0$ | $L_2$ | $L_1$ | $L_0$ |

DEEP NEURAL NETWORK A POSTERIORI PROBABILITY DETECTORS AND MEDIA NOISE PREDICTORS FOR ONE- AND TWO-DIMENSIONAL MAGNETIC RECORDING

CROSS-REFERENCE TO RELATED APPLICATION(S)

The present application claims under 35 U.S.C. § 119, the priority benefit of U.S. Provisional Application No. 62/855,644, filed May 31, 2019, entitled "Deep Neural Network a Posteriori Probability Detectors and Media Noise Predictors for One- and Two-dimensional Magnetic Recording," which is incorporated herein by reference in its entirety.

GOVERNMENT INTERESTS

This invention was made with government support under grant no. 1817083 awarded by National Science Foundation. The government has certain rights in the invention.

FIELD OF THE INVENTION

The present embodiments herein relate to the detection and media noise prediction of one- and two-dimensional magnetic recording for hard disk drives. In particular, the present system and method embodiments, as disclosed herein, often but necessarily enable a trellis-based detector and a deep neural network (DNN) turbo-equalization architecture.

BACKGROUND OF THE INVENTION

Discussion of the Related Art

Conventionally, one dimensional magnetic recording (1DMR) has been in use in the hard disk drive (HDD) industry. HDD recording channels have media noise, which results from magnetic grain-bit interactions and is signal dependent. Typical signal processing for conventional 1DMR includes one dimensional (1D) pattern dependent noise prediction (PDNP), (noise tends to be largest when there is a magnetic transition between bits), which has become a standard practice in the HDD industry. 1D-PDNP assists a trellis-based detector like, for example, a Bahl-Cocke-Jelinek-Raviv (BCJR) or a Viterbi algorithm (VA) in detecting recorded coded data bits read by the read head of an HDD in the presence of intersymbol interference (ISI), (i.e., form of distortion of a signal in which one symbol interferes with previous or subsequent symbols recorded on the HDD) and media noise, and exchanges log-likelihood ratios (LLRs), (i.e., a measure of the reliability of a detected coded bit from the HDD, based on the log of the ratio of the probabilities of the coded bit being either +1 or −1), with a channel decoder.

Due to a phenomenon called the superparamagnetic effect, the HDD industry is approaching an areal density limit for conventional 1DMR. To achieve an order of magnitude increase in HDD capacity without requiring radical redesign and recording media, two-dimensional magnetic recording (TDMR) is also being implemented. Typical signal processing for conventional TDMR includes two dimensional (2D)-PDNP and multi-track detection using a local area influence probabilistic (LAIP)-BCJR system.

In a typical single track signal processing methodology, the received samples from the read head are filtered by a linear equalizer with a one dimensional (1D) partial response (PR) target h, giving an effective channel model of $y=h*u+n_m+n_e$, where u are the coded bits on the track, * indicates 1D convolution, $n_m$ is media noise, $n_e$ is reader electronics additive white Gaussian noise (AWGN), and the effective ISI channel length $I=length(h)-1$. The term $n_m$ models signal dependent noise due to, e.g., magnetic grains intersected by bit boundaries, which can influence two or more bit readback values. The equalizer output y flows into a trellis-based (Viterbi or BCJR) detector that employs a super-trellis based on the effective ISI channel and a 1D-PDNP algorithm.

PDNP is based on an Lth order trained autoregressive (AR) media noise model $\tilde{n}_{m_k}$: $\tilde{n}_{m_k}(u_k) = \sum_{i=1}^{L} a_i(u_k) \tilde{n}_{m_{k-i}}(u_k) + e_k(u_k)$, where the $a_i$ are the AR coefficients, and the model error $e_k$ is assumed to be uncorrelated Gaussian noise that depends on the coded bit pattern vector $(u_k)$ [ $u_{k+\Delta}, \ldots u_k, \ldots, u_{k-(I+L)}$]. The number of super-trellis states for $N_t$-track PDNP detection is $2^{N_t(I+L+\Delta)}$, where L is the predictor order and $\Delta$ is the predictor look-ahead with typical values $I \leq 3$, $L \leq 4$ and $\Delta \leq 1$. The L model coefficients $a_i(u_k)$ for each pattern vector $u_k$ are trained and computed offline. The trellis detector sends soft coded bit estimates to a channel decoder to determine the user bits.

There are two problems with PDNP. First, when the number of tracks $N_t$ simultaneously processed is greater than one, e.g., in TDMR, the number of trellis states can become impractically large. In proposed generalizations to two-dimensional (2D)-PDNP for a two reader TDMR, the trellis state cardinality becomes $4^{I+L+\Delta}$. The complexity grows exponentially with I+L, and becomes impractical for more than two readers; this is the state explosion problem. Second, the AR noise model and linear prediction used in PDNP is somewhat restrictive and may not accurately represent the media noise, especially at high storage densities; this is the modelling problem.

In a typical three-track LAIP-BCJR detection system for TDMR, a LAIP a priori detector passes its estimates to a BCJR detector to detect coded bits in presence of ISI, inter-track interference (ITI) and media noise. Conventionally, LAIP-BCJR detector estimates media noise in a 3×3 local area. The LAIP detector employs a relatively simple machine learning method, i.e., trained conditional probability mass function (PMF) tables. The LAIP-BCJR detector achieves significant detector bit error rate (BER) reductions over 2D-PDNP.

It is also to be noted that the traditional neural network (NN) techniques employ relatively simple network structures (with usually around 3 layers) and training techniques. By contrast, deep Neural Networks (DNNs) are advanced learning techniques as compared to neural networks. DNNs feature a relatively large number (typically ≥5) of interconnected network layers, with each network layer containing multiple hidden layers and non-linear output layer as compared to one hidden layer and an output layer in a NN. These extra hidden layers help with improved ability to generalize from a limited set of training data in order to correctly classify or perform estimation on new data presented to the network during real-time operation. DNN provides improved and advanced modelling through learning and generalization of complex non-linear relationships in data as compared to a NN. Recent breakthroughs in DNNs have led to great success in applications such as speech recognition, image understanding, and language translation.

In addition, DNNs can learn a probabilistic model from the data. As DNN models are much more general than AR models, they give a better estimate of magnetic media noise $n_m$ than PDNP, and hence lead to reduced detector bit error rates (BERs) compared to PDNP. In TDMR, down-track ISI can span around 10 to 20 bits, whereas the media noise term affecting a given target bit is primarily due to local grain bit interactions that occur in a 2D neighborhood of the target bit. Thus, it makes sense to consider HDD readings as either sequential data or spatially correlated data, and a DNN is capable of outperforming the LAIP-BCJR detector in detecting coded bits in such a scenario.

Background information on an example neural network system can be found in U.S. Pat. No. 5,978,782, entitled, "Neural network signal processor for magnetic storage channels," to William Shields Neely, filed Jul. 5, 1996, including the following: "[a] neural network based Signal processor for a magnetic Storage channel, Such as a magnetic disk drive for a computer, uses a multiple layer perceptron neural network to perform the Symbol Sequencing detection, equalization and decoding of information Signals retrieved from the magnetic Storage medium."

Background information on a waveform equalizer apparatus as part of a neural network system can be found in U.S. Pat. No. 5,361,327, entitled, "WAVEFORM EQUALIZER APPARATUS FORMED OF NEURAL NETWORK, AND METHOD OF DESIGNING SAME," to Susumu Takahashi, effective filing date of Jan. 31, 1991, including the following: "[a] waveform equalizer for reducing distortion of a digital signal produced from a digital data recording and playback system or transmission system is formed of a neural network having fixed weighting coefficients. Respective values for the coefficients are established by generating a corresponding simulated neuron network, by software implementation using a computer, and by executing a neuron network learning operation using input values obtained from a distorted digital signal and teaching values obtained from an original digital signal which resulted in the distorted digital signal."

Background information on a neural network model for two-dimensional magnetic recording, is described in IEEE publication, entitled "Modeling of Writing Process for Two-Dimensional Magnetic Recording and Performance Evaluation of Two-Dimensional Neural Network Equalizer," published in IEEE Transactions on Magnetics (Volume: 48, Issue: 11, Pages: 4586-4589, November 2012) including the following: " . . . A new designing method of a two-dimensional neural network equalizer with a mis-equalization suppression function (2D-NNEMS) for TDMR is also proposed. The bit-error rate (BER) performance of a low-density parity-check coding and iterative decoding system with the designed 2D-NNEMS is obtained via computer simulation using a read/write channel model employing the proposed writing process under TDMR specifications of . . . "

Background information on a two-dimensional neural network equalizer is described in IEEE publication entitled "Read/write channel modeling and two dimensional neural network equalization for two-dimensional magnetic recording," published in IEEE Transactions on Magnetics (Volume: 47, Issue: 10, Pages: 3558-3561, October 2011) including the following: " . . . a two-dimensional neural network equalizer (2D-NNE) is proposed to mitigate the influence of intertrack interference and jitter-like medium noise. The bit-error rate performance of partial response class-I maximum likelihood (PR1ML) system with the 2D-NNE is obtained by computer simulation based on the proposed read/write channel model . . . "

Accordingly, a need exists in the industry for an improved deep neural network (DNN) system that employs a DNN media noise predictor that is often combined with a trellis-based ISI detection component in a turbo architecture. In particular, the present embodiments address such a need via a configuration that avoids the state explosion by separating the ISI detection and media noise estimation into two separate detectors and uses the turbo-principle to exchange information between them, thus avoiding use of a super-trellis. To address the modeling problem, the embodiments herein are configured to train DNN-based media noise estimators.

BRIEF SUMMARY OF THE DISCLOSURE

An aspect of the embodiments herein includes a method of noise detection and prediction for a hard disk drive (HDD) that includes: receiving at an equalizer, a plurality of hard disk drive readings that correspond to one or more coded bits configured as a vector r, wherein the one or more coded bits configured as a vector r includes a plurality of samples $r^{(1)}$, $r^{(2)}$ up to $r^{(m)}$; detecting a partial response equalized filtered output $y^{(1)}$ resulting from the received sample $r^{(1)}$ at a trellis-detector; wherein an intersymbol interference resulting from the partial response equalized filtered output $y^{(1)}$ is reduced and wherein a first block of coded bit log-likelihood ratios ($LLR_b$) and a second block of coded bit log-likelihood ratios ($LLR_b$) are outputted; iteratively decoding one or more error correction codes embedded in the second block of log-likelihood ratios ($LLR_b$) so as to output a third block of log-likelihood ratios ($LLR_1$); receiving at a deep neural network noise predictor, the first block of coded bit log-likelihood ratios ($LLR_b$), the partial response equalized filtered output $y^{(1)}$, the third block of log-likelihood ratios ($LLR_1$), and the one or more samples $r^{(2)}$ up to $r^{(m)}$, wherein the deep neural network noise predictor is configured to predict a media noise term of the partial response equalized filtered output $y^{(1)}$, and wherein the one or more samples $r^{(2)}$ up to $r^{(m)}$, the first block of coded bit log-likelihood ratios ($LLR_b$) and the iteratively decoded second block of log-likelihood ratios ($LLR_1$) improves estimation of the media noise and reduces a bit error rate (BER); and turbo equalizing through iteratively exchanging between the trellis-detector, the deep neural network noise predictor and the channel decoder in multiple passes so as to provide an improved media noise estimate $\tilde{n}_m$ of the media noise, and wherein the trellis detector is configured to cancel the media noise after multiple iterations upon a converged bit error rate (BER).

Another beneficial aspect of the embodiments herein includes a noise detection and prediction system for a hard disk drive (HDD) that includes: a plurality of hard disk drive readings that correspond to one or more coded bits configured as a vector r, wherein the one or more coded bits configured as a vector r includes a plurality of samples $r^{(1)}$, $r^{(2)}$ up to $r^{(m)}$; a trellis-detector configured to receive a partial response equalized filtered output $y^{(1)}$ resulting from a received sample $r^{(1)}$, wherein a intersymbol interference resulting from the partial response equalized filtered output $y^{(1)}$ is reduced, and wherein a first block of coded bit log-likelihood ratios ($LLR_b$) and a second block of coded bit log-likelihood ratios ($LLR_b$) are outputted from the trellis detector; a channel decoder configured to decode one or more error correction codes embedded in the second block of log-likelihood ratios ($LLR_b$) so as to output a third block of log-likelihood ratios ($LLR_1$); and a deep neural network noise predictor configured to receive the first block of coded bit log-likelihood ratios ($LLR_b$), the partial response equalized filtered output $y^{(1)}$, the third block of log-likelihood ratios ($LLR_1$); and one or more samples $r^{(2)}$ up to $r^{(n)}$, wherein the deep neural network noise predictor is configured to predict a media noise term within the partial response equalized filtered output $y^{(1)}$, and wherein the one or more samples $r^{(2)}$ up to $r^{(n)}$, the first block of coded bit log-likelihood ratios ($LLR_b$) and the iteratively decoded third block of log-likelihood ratios ($LLR_1$) improves estimation of the media noise and reduces a bit error rate (BER).

And yet another beneficial aspect of the embodiments herein includes: a noise detection and prediction system for a hard disk drive (HDD), comprising: a deep neural network a posteriori probability (APP) detector, wherein the deep neural network a posteriori probability (APP) detector is configured to predict and cancel a media noise, a down track intersymbol interference and an intertrack interference; a partial response equalizer is configured to reduce the size of the down track intersymbol interference and the intertrack interference further reducing a complexity of the deep neural network a posteriori probability (APP) detector; and a decoder configured to iteratively exchange one or more LLRs of the coded bits with the deep neural network a posteriori probability (APP) detector.

In more detail, the embodiments herein provide for a DNN based media noise predictor modelled to operatively work with a trellis-based detector (BCJR/VA) to reduce the bit error rate (BER) and computational time and complexity of 1DMR as well as TDMR configurations. To avoid state explosion, the ISI detection and media noise estimation, as disclosed herein, are separated into two individual detectors and the turbo-principle is used to exchange information between them, thus avoiding use of a super-trellis.

In addition, the system and method embodiments herein exploit the improved media noise modeling capabilities of DNN combined with minimal number of trellis states in the trellis-based ISI detector in a turbo architecture. Unlike existing architecture models, the architecture herein uses advanced deep neural network techniques and trellis-based detection processing in a turbo-equalization loop achieving significant information areal density increase for the HDD and reduced BER at minimal cost in computational complexity with each iteration of the turbo-iterative loop compared to the traditional neural network techniques combined with linear equalizers in background literature which receive readings directly from the HDD.

Moreover, a DNN based a posteriori probability (APP) detection system presented herein can be used as a TDMR detection system. As compared to the trellis-DNN turbo detector example, this example embodiment replaces the trellis-based detector and the DNN based media noise predictor by a single DNN that directly estimates the coded bits.

Lastly, the system and method embodiments herein capitalize on the benefits of DNN APP three-track detectors for TDMR architectures. In contradistinction to existing models, the architecture herein can be configured to use a linear minimum mean-squared error filter with a partial response signaling as a pre-processing step to limit the DNN complexity, wherein the method exploits spatial correlation to improve iterative decoding performance and a DNN training-per-iteration approach for iterative decoding with a channel decoder.

DETAILED DESCRIPTION OF THE DISCLOSURE

Figure 1A:
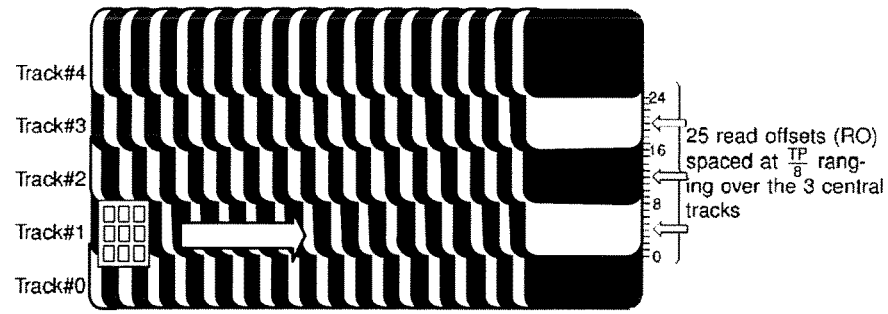
FIG. 1A shows a cartoon representation of the writing process and readback sampling position

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

General Description

A beneficial example embodiment herein includes a Deep Neural Network (DNN) based media noise predictor modelled to operatively work with a trellis-based detector in a turbo-equalization system architecture. Examples of trellis-based detection methods include, but are not strictly limited to, a Bahl-Cocke-Jelinek-Raviv (BCJR) or a Viterbi algorithm (VA).

The system model for a trellis-DNN turbo equalization architecture of the present invention is presented as follows. The trellis-DNN turbo detector assumes a channel model for the kth linear equalizer filter output y(k) similar but different to that of the 1D PDNP approach:

$$y(k)=(h*u)(k)+n_m(k)+n_e(k) \quad (1)$$

where h is the Partial Response (PR) target, u are the coded bits on the track, * indicates 1D convolution, $n_m(k)$ is media noise, $n_e(k)$ is reader electronics AWGN, and the ISI channel length I=length (h)−1. Unlike PDNP, the media noise term $n_m(k)$ is not modeled as an AR process; instead a more general model is utilized by the DNN through offline training.

It is to be appreciated that simulated HDD readings based on a Grain flipping probabilistic (GFP) model were used, wherein acquired GFP model data enabled training and evaluating the system herein, and wherein GFP waveforms were generated based on micro-magnetic simulations. To illustrate a non-limiting working of the methods and configurations herein, a simulated media (HDD) grain density of 11.4 Teragrains per square inch for the GFP model data was utilized. Such GFP waveforms corresponded to five tracks of coded bits (±1), denoted as tracks #0 through track #4, as shown in FIG. 1A. They are written using a shingled writing technology which is a state-of-the-art technique for writing data onto a conventional HDD. As shown by the graphical representation in FIG. 1A, the bit regions appear as curved stripes and not rectangular due to the relative orientation of the corner write head. Track #0 at the bottom is written first. Then track #1 is written, overlapping part of track #0. The writing process repeats until track #4 is written. Track #4 is called the fat track, since it is not followed by any additional tracks and thus preserves the original magnetic-write width (MWW), which for this example, was about 75 nm.

In the GFP simulation, the bit length (BL) was 11 nm. Two GFP data sets were used for evaluation of the system herein. For the first data set, the track pitch (TP) (i.e., the distance between adjacent tracks) was about 48 nm and for the second, the TP was about 27 nm. The number of grains per coded bit (GPB) for the 48 nm TP data set was, GPB=Grain density×BL×TP=9.33 grains/bit. Similarly, for the 27 nm TP data set, the computed GPB was equal to 5.25 grains/bit. For the testing the TDMR version of the trellis—DNN detector, TP of 18 nm was used for the second data set. Each track in the GFP data set provided 41206 coded bits, which is close to the sector size of 32768 bits (4K bytes) in a typical HDD. $N_s$ is the number of bits in the HDD sector (or series of sectors) being read, hence $N_s$=41206 in the present scenario. The readings from the center of Track #2 were used as input to the trellis-DNN turbo detector.

Another example embodiment is a DNN based a posteriori probability (APP) detection architecture with parallel multi-track detection for TDMR channels. This system architecture replaces the trellis-based BCJR or Viterbi algorithm (VA) in a typical TDMR scenario. This architecture directly outputs LLRs of the coded bits and iteratively exchanges them with a subsequent channel decoder to achieve minimized BER.

The system model for the DNN based a posteriori probability (APP) detection architecture is presented as follows. Similar to the trellis-DNN turbo equalization architecture, the architecture herein assumes a channel model and HDD readings based on a GFP model data. To aid the reader in understanding the embodiments herein, FIG. 1A is used to represent the writing process for such GFP model data wherein the white stripes represent+1 coded bits and the black stripes represent −1 coded bits. The 3×3 white square denotes a 3×3 convolutional filter applied on the data. The white arrow indicates the direction that the filter moves.

In this example of the GFP model data, the simulated media had a grain density of 11.4 Teragrains per square inch, which was calculated to be 0.0177 grains per square nanometer and five tracks of coded bits with a magnetic-write width (MWW) of about 75 nm. In the GFP simulation, the bit length (BL) was 11 nm and the TP was 18 nm. Thus, the grains per coded bit (GPB) calculated for this example was, GPB=Grain density×BL×TP=0.0177 grains/nm²×(11×18) nm²/bit=3.5 grains/bit. The input bits in the GFP data herein are arranged in tracks #0 through #4, as similarly discussed above for FIG. 1A, and are of size 5×$N_b$, where $N_b$ is the number of bits per track, or the track length. Their values being randomly distributed and known. Of these five tracks, only tracks #1, #2 and #3 have readback values, and thus the readback values are of size 3×$N_b$. There are 25 read offsets spaced at TP/8, as shown in FIG. 1A, ranging over tracks #1, #2, and #3. To sample the data on these three central tracks, reader positions at 4, 12 and 20 (as illustrated to the right in FIG. 1A) were used approximately at the center of each track.

For the DNN APP detector, two sets of GFP data were generated, having the same BL and TP, but different reader and writer parameters during the GFP simulation. Each track in GFP data set #1 comprised of 41,206 coded bits, and there are 41,207 coded bits in GFP data set #2; this is close to the sector size of 32,768 bits (4K bytes) in a typical HDD. The bits written on the two outer tracks have no readings available, and are considered boundary bits. The simulated channel for these two data sets were significantly different. The shingled writing process shown in FIG. 1A for TDMR configurations also introduces Inter-Track-Interference (ITI). As the magnetic-write width (MWW) is fixed in HDD, a smaller TP in case of TDMR results in a greater ITI. GFP data set #1 suffered more ITI from both adjacent tracks than GFP data set #2.

Accordingly, example embodiments herein provide for a trellis-DNN turbo detector implementation for 1DMR and TDMR, which includes a turbo-equalization structure that separates the inter-symbol interference (ISI) detection and media-noise prediction functions into two detectors that iteratively exchange log-likelihood-ratio (LLR) estimates of coded bits and noise samples until convergence to a low BER occurs.

Moreover, the embodiments herein also provide for a DNN based APP multi-track detector, (such as, but not limited to, a two-track, three-track, four-track, five-track detector and greater), for TDMR, which includes a DNN based data detection model wherein pre-processing is done through a linear PR equalizer to partially equalize the ITI and the down-track ISI, and iteratively exchange log-likelihood ratios (LLRs) of coded bits with a channel decoder to achieve low BER and computational complexity.

Specific Description

Figure 1B:
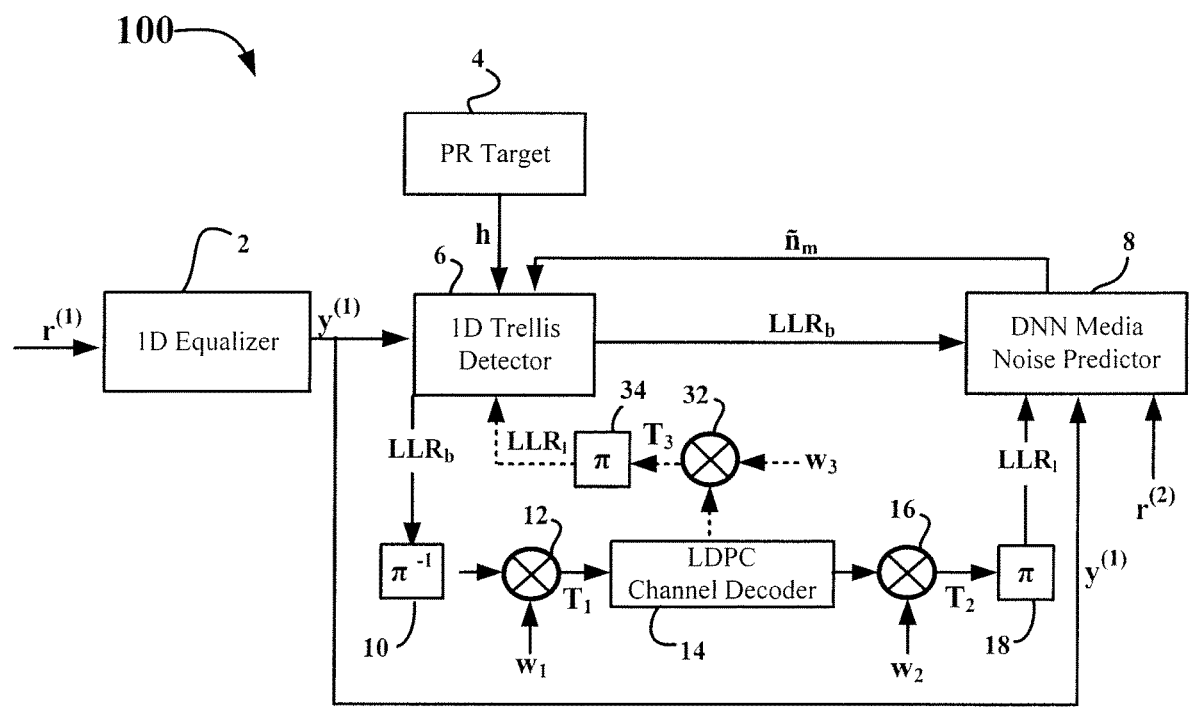
FIG. 1B shows a beneficial example block diagram for a trellis-DNN turbo detector for 1DMR, as disclosed herein.

Turning back to the drawings, FIG. 1B represents a signal processing system block diagram for an illustrative trellis-DNN turbo detector architecture that can be used for 1DMR, as generally referenced by the numeral 100. The example embodiment of FIG. 1B that is shown as a 1DMR architecture, is capable of handling one, two, or more samples per bit from an HDD read head. The bits to be written onto the HDD are assumed to be channel coded with an error correction code. In such an architecture 100, it is assumed that the bits are coded with a low-density parity-check (LDPC) code, but it can be any type of error correction code, as known by those of ordinary skill in the art, such as, for example, a Cyclic code or a Reed-a Solomon code. The bits to be written onto the HDD which are channel coded with an error correction code are then written onto the HDD in a scrambled, or interleaved order. This often requires the use of an interleaver as known in the art, e.g., 18, 34 as shown in FIG. 1B disclosed herein, after the channel encoder. The channel encoder and the interleaver after the channel encoder are not shown in FIG. 1B.

In FIG. 1B, the GFP simulated HDD read-head (not shown) output vector r contains two samples per coded bit each of length $N_s$, denoted $r^{(1)}$ and $r^{(2)}$. The vector r can contain up to n samples per coded bit, $r^{(1)}$, $r^{(2)}$ up to $r^{(n)}$ each of length $N_s$. These samples are on the same track and are collected by the same read-head, but are located at different down track locations within a given bit. The first samples per bit $r^{(1)}$, as shown in FIG. 1B, considered as the odd samples are located near the center of each bit and the even samples $r^{(2)}$ per bit, as also shown in FIG. 1B, are located at the boundary between bits.

In a method of operation utilizing the architecture in 100, the odd samples $r^{(1)}$ are first input to an equalizer 2, such as, for example, a linear equalizer, of length 15 in this illustrative example, designed to minimize the mean squared error (MMSE) between the equalizer's 2 filtered output $y^{(1)}$, as shown in FIG. 1B, and the convolution of the coded bits u (i.e., the bits originally written onto the HDD) with the 1D PR mask (1-dimensional partial response mask) h, which is the PR target 4. A non-linear PR equalizer can also be used for this architecture to achieve similar results.

The PR mask h in reference to the PR target 4 is a sampled finite impulse response (FIR) filter which is represented as $a_0 + a_1 D + a_2 D^2$, where $a_0$, $a_1$ and $a_2$ are the coefficients of h. PR filters are designed using several methods. The PR equalization in the embodiments herein is done to shorten the effective down track ISI. To achieve this, UE (unit energy) and monic constraints have been used. UE constraint means that the sum of the squares of the coefficients of h equals one. Monic constraint means that the central coefficient of h is one, such as, for example, for a three tap PR mask with monic constraint, the PR target h has coefficients (0.5, 1.0, 0.5). The effective down track ISI, such as, for example, an effective down track ISI of 15 or 20 bits in length, will be longer than the length of the known PR mask h, which is typically two to five samples. Length of PR mask h determines the number of trellis states of the trellis based detector. For reduced complexity of the trellis based detector, experimentally it has been seen that using PR mask h of length I+1, with I typically being one or two is beneficial.

The equalizer's 2 filtered output $y^{(1)}$ is input to a trellis-based detector 6. The trellis-based detector can be either a soft-output Viterbi algorithm (SOVA), which has relatively lower complexity but cannot accept log-likelihood-ratio (LLR) input from a channel decoder and thus permits only "one-loop" channel decoding, or it can be a Bahl-Cocke-Jelinek-Raviv (BCJR) detector which permits iterative decoding with the channel decoder, as shown by the arrows labeled $LLR_b$ and $LLR_1$ in FIG. 1B flowing between the trellis-detector 6 and the channel decoder 14 in the system 100.

The trellis-based detector 6 handles only ISI equalization based on the PR target h and outputs a block $LLR_b$ of $N_s$ coded bit LLRs. The output h from 4 is designed with three taps, so that the ISI channel length I=2, and the BCJR detector has $M=2^I=4$ states and 2M=8 total branches. The trellis detector's coded bit LLR outputs, $LLR_b$ from 6 are sent to the DNN media noise predictor 8 to predict the signal dependent media noise. DNN media noise predictor 8 provides an estimate $\tilde{n}_m$ of the media noise as output. This output media noise estimate is then fed back to the trellis-detector 6 in an iterative manner. This input to the next iteration of 6 is given in order to improve the trellis detector's estimate $LLR_b$. In the BCJR's gamma probability computation for the jth trellis branch at trellis stage k, the exponent in the Gaussian conditional channel probability density function (PDF) is $(y_k^{(1)} - (h^*v)_l - \tilde{n}_{m_l})^2$, where $v_j$ denotes the vector branch label for branch j (which has the same length as h), and l is the index corresponding to $y_k^{(1)}$; thus, an accurate estimate of the media noise maximizes this PDF when $v_j$ corresponds to the correct data bits.

Figure 1C:
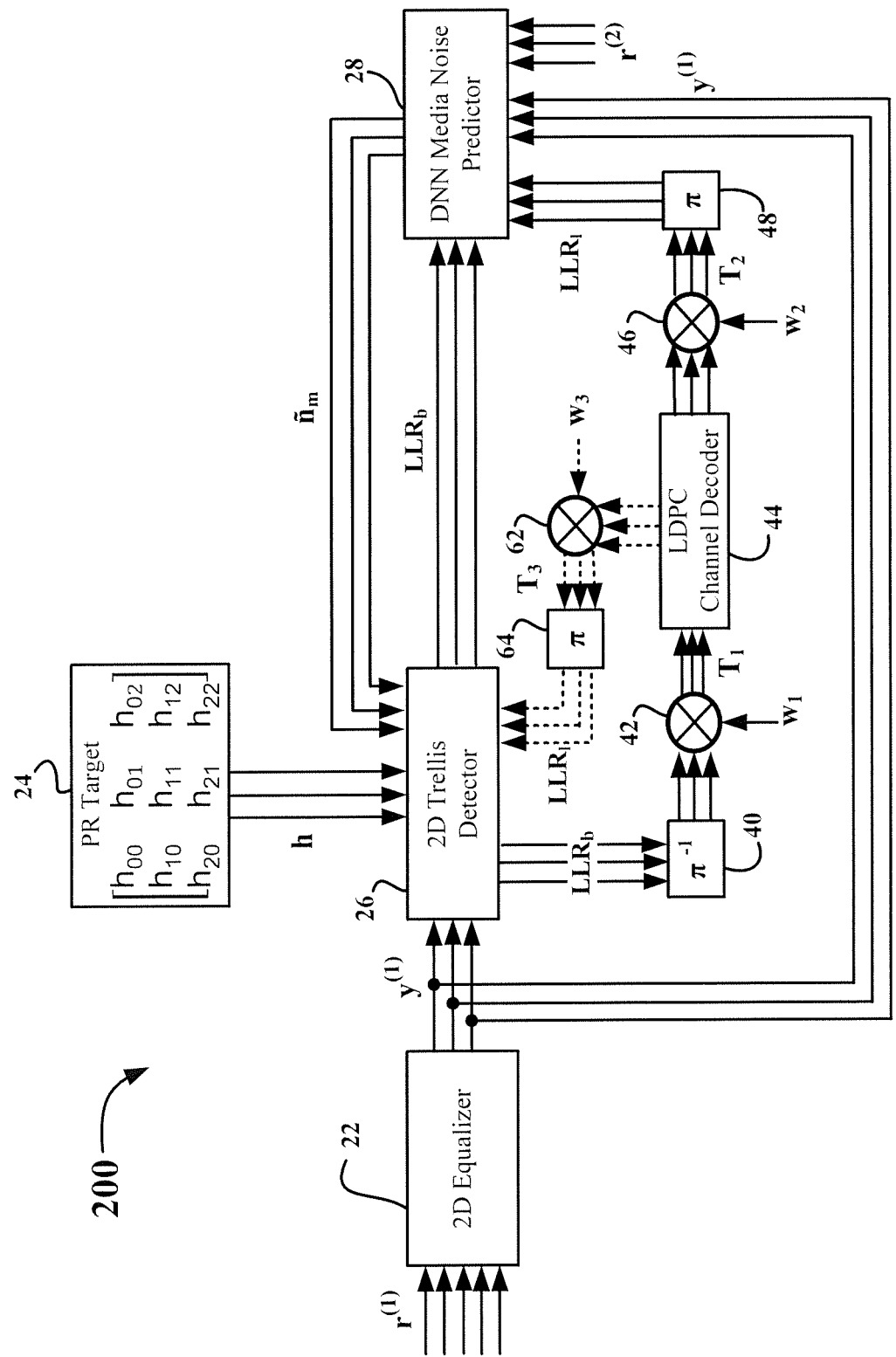
FIG. 1C shows a beneficial example block diagram for a trellis-DNN turbo detector for TDMR, as disclosed herein.

The DNN inputs also include the filtered first sample sequence $y^{(1)}$ from the 1D Equalizer 2 and the even reading samples $r^{(2)}$ up to $r^{(1)}$ (only $r^{(2)}$ shown in FIG. 1B and FIG. 1C for simplicity) from the read-head. Experimentally it was found that providing $r^{(2)}$ up to $r^{(n)}$ as an additional input to the DNN media noise predictor 8 measurably improves the DNN's estimation of the media noise and hence reduces the bit error rate (BER) of the trellis detector's output in the next iteration. The DNN processes each of its inputs (e.g., the input $y^{(1)}$) by considering $N_w$ samples at a time, where window size $N_w$ is an odd number; the scalar media noise estimate $\tilde{n}_m$ for each block of $N_w$ samples corresponds to the bit in the center of the $N_w$ samples. In the embodiment shown in FIG. 1B, $N_w=9$. If more than two samples per bit are available, the other unfiltered samples can also be inputs to the DNN.

After the trellis detector's second iteration using the media noise estimate $\tilde{n}_m$, the trellis detector 6 sends an improved LLR vector estimate $LLR_b$ to the LDPC channel decoder 14. The LLRs in $LLR_b$ are deinterleaved (unscrambled) by an inverse interleaver 10 denoted as $\pi^{-1}$ in FIG. 1B which restores them to the same order as the original bits output from the channel encoder before interleaving and writing bits onto the HDD. The purpose of the deinterleaver (inverse interleaver of which is known in the art) is to decorrelate the LLRs sent to the channel decoder 14, as the channel decoder's performance is enhanced when its inputs are effectively statistically independent. After the inverse interleaver 10, the LLRs are multiplied using a multiplier 12 by a weight $w_1 > 0$ and then limited in magnitude (while preserving their signs) to a value $T_1$. The magnitude limiting prevents the LLRs from becoming too large and causing numerical overflow or underflow in the channel decoder 14. The multiplicative weight $w_1$ is conventionally set to be less than or equal to 1.0. Setting this value to less than 1.0 is valuable if multiple iterations are done between the channel decoder 14 and the trellis detector 6, because down-weighting the LLRs slows the convergence of the iterative algorithm and results in a lower BER once convergence occurs.

If the trellis detector 6 is a BCJR detector, the channel decoder 14 has the capability to send its decoded LLR estimates $LLR_1$ of the channel coded bits u back to the BCJR detector 6 for subsequent iterations, with the BER improving on each iteration until it has converged. The decoded LLR estimate $LLR_1$ of the channel decoder 14 is multiplied by weight $w_3$ and magnitude limited to value $T_3$ by multiplier 32. This magnitude limited value is interleaved using an interleaver 34 denoted as $\pi$ before it enters the trellis detector 6. Then after the desired number of iterations when the BER is converged, the decoded LLR estimates $LLR_1$ can either be compared with zero to generate a final decision, or it can be sent back to the DNN predictor 8 for a second DNN iteration. To send back the channel decoder 14's LLR estimates back to the DNN for a second iteration, the LLR estimate is multiplied by weight $w_2$ and magnitude limited to value $T_2$ by multiplier 16 and then interleaved by an interleaver 18 denoted by $\pi$ before the LLR estimates enter the DNN media noise predictor 8. The weights $w_1$ through $w_3$ and magnitude limits $T_1$ through $T_3$ are optimized in order to minimize the BER at the channel decoder 14's output after all iterations are completed. If the trellis detector 6 is a SOVA detector, the iterations with the channel decoder 14 are not possible. On receiving the trellis detector's LLR estimate vector $LLR_b$, the channel decoder's generated LLR vector $LLR_1$ can either be compared with zero to generate a final decision, or it can be sent back to the DNN predictor 8 for a second DNN iteration.

After the second DNN iteration, an improved media noise estimate $n_m$ is generated and sent back to the trellis detector 6 and another iteration between the trellis detector-channel decoder-DNN commences. After the desired number of iterations are done and the BER has converged, as a final step the channel decoder 14 output LLRs LLR are threshold and compared to zero to generate the final bit decisions, i.e. the decoded bit $u_k$=+1 if $LLR_k$>0, and $u_k$=−1 if $LLR_k$<0, with a random equiprobable choice of ±1 made for $u_k$ if $LLR_k$=0.

Several DNN media noise estimation architectures based on fully connected deep neural network (FCDNN) and convolutional neural networks (CNNs) are investigated in the experiments performed on the system 100. For GFP data set at 48 nm track pitch and 11 nm bit length the CNN-based BCJR-DNN turbo detector surprisingly and unexpectedly gives better results as compared to conventional detection techniques included in background. The CNN-based BCJR-DNN turbo detector reduces the detector BER by 0.334× and the per bit computational time by 0.731× compared to a BCJR detector that incorporates 1D pattern-dependent noise prediction (PDNP).

The proposed trellis-DNN turbo detection architecture shown in FIG. 1B is also generalized to multi-track detection for TDMR with 2D processing functions instead of 1D functions working in a similar way as the trellis-DNN turbo detection in FIG. 1B. FIG. 1C shows such a system architecture for multi-track detection for TDMR as referenced by numeral 200. For example, for $N_t$ tracks simultaneously detected, a 2D linear equalizer 22 and 2D PR target 24 with $N_t$ rows is employed. The trellis detector jointly equalizes down-track ISI as well as inter-track interference (ITI), and its number of trellis states M becomes $M=2^{N_tI}$; e.g., M=64 for current embodiment wherein $N_t$=3 and I=2; however, other choices of these parameters could be made. Thus, by limiting the trellis detector to ISI or ISI-ITI detection only, the trellis state explosion problem is circumvented.

In particular, for TMDR the generalized architecture 200 in FIG. 1C, the sample $r^{(1)}$ of the GFP simulated HDD read-head output vector r is formed by $N_t$+2 HDD tracks (of length $N_s$ each). Sample $r^{(1)}$ is filtered by an $N_t$+2 input, $N_t$ output 2D PR linear equalizer filter 22. The two extra input tracks to the linear equalizer are boundary tracks. These boundary tracks are assumed to be known to within some BER. For example, they might be previously cached and known perfectly or to within only a few bit errors per track. They can also be estimated by a relatively low-complexity 1D detector, such as a 1D trellis detector with a decoder set to the same rate that the tracks were encoded at.

The PR linear equalizer 22 receives the $N_t \times N_s$ samples read from the HDD and equalizes the read head sample to PR mask h output from the PR target 24. PR mask h consists of $N_t$ rows and I+1 columns. After the 2D PR filter 22, the $N_t \times N_s$ filtered readings $y^{(1)}$ flow into a 2D trellis detector 26. The trellis detector 26 can either be a BCJR detector or a SOVA detector with $2^{(N_t \times I)}$ trellis states. In the current embodiment of system 200, trellis detector 26 often has trellis states=64. 2D versions of BCJR or SOVA based trellis detectors limit the trellis complexity to manageable values as compared to 2D versions of PDNP.

The DNN media noise predictor 28 in the TDMR system 200 has the same input variables as the 1DMR system, but each has a size of $N_t \times N_s$. The DNN media noise predictor 28 processes its inputs in 2D layers of size $N_t \times N_w$, where the window size $N_w$=9 for the current embodiment. A key difference between the TDMR and 1DMR architectures is that TDMR architecture has two versions of the DNN processing. In the first version, DNN media noise predictor 28 comprises of a single DNN which processes the $N_t \times N_w$ input layers (one layer per input variable), and produces $N_t$ simultaneous media noise estimates, corresponding to the data bits at the center of each $N_w$ window of each $N_t$ tracks. In the second version of DNN media noise predictor 28, there are $N_t$ DNNs, one for each track, but each DNN produces only one media noise estimate for its corresponding track. As demonstrated in working embodiments, it has been shown that dedicating one DNN per track gives improved results compared to using one DNN to simultaneously estimate the media noise on all $N_t$ tracks.

The LDPC channel decoder 44 in the system 200 in FIG. 1C, is $N_t$ channel decoders for TDMR architecture, one per track. (note that interleaver 48, inverse interleaver 40, multipliers 42, 46, 64, and respective weights $w_1$, $w_2$, $w_3$ operate as similarly discussed above for FIG. 1B and are not discussed in detail for this example for simplicity) cannel decoding is done per track herein. Each of the $N_t$ tracks are allowed to have a different channel coding rate, under the assumption that each track has a header which specifies the code rate. In addition, it is to be noted that the weights $w_1$, $w_2$ and $w_3$ are vectors of $N_t$ weights, with one weight per each of the $N_t$ tracks, to allow for different LLR statistics on the different tracks. The magnitude limitation values $T_1$, $T_2$ and $T_3$ are also vectors of $N_t$ magnitude limits. In this way, the code rate of the $N_t$ tracks for channel decoding, the weights and the magnitude limits are optimized over all $N_t$ tracks, and a higher overall areal density is achieved than using a single code rate for all $N_t$ tracks, or single weight and magnitude limit values for all $N_t$ tracks. However, there exist other possible ways of distributing the coded bits over the $N_t$ tracks that can be used with the architecture presented herein in system 200. Specifically, using one codeword over all three tracks and interleaving the code bits over all three tracks allows the codeword length to go up by a factor of $N_r$, and longer codeword usually enables the channel decoder to achieve lower BERs.

In particular, for interfacing the trellis-based detector to the DNN for 1DMR and TDMR, different methods can be employed. The methods employed herein include, but are not strictly limited to, 1 DNN and 8 DNNs. In the 1 DNN method, DNN media noise predictor 8 in FIG. 1B and 28 in FIG. 1C estimates the media noise $\tilde{n}_{m_k}$ (shown as $\tilde{n}_m$ in FIG. 1C), or the kth detector trellis stage (6 in FIG. 1B and 26 in FIG. 1C) based on $LLR_b$ (and on y(1) and $r^{(2)}$ and then passes this estimate $\tilde{n}_{m_k}$ to all eight detector branches. In the second method employed herein, namely 8 DNNs, a media noise estimate $$\tilde{n}_{m_{k_j}}, 0 \le j \le 7,$$

for the jth branch of the kth detector (6 in FIG. 1B and 26 in FIG. 1C) trellis stage is provided by a DNN, denoted $DNN_j$, dedicated to and trained for the jth branch. Thus, at each trellis stage eight separate DNNs (which can operate in parallel) provide eight separate media noise estimates, one for each trellis branch for the 1DMR architecture shown in FIG. 1B, whereas for the TDMR architecture shown in FIG. 1C, at each trellis state 512 separate DNNs provide 512 separate media noise estimates, one for each trellis branch.

Figures 2A, 2B, 3:
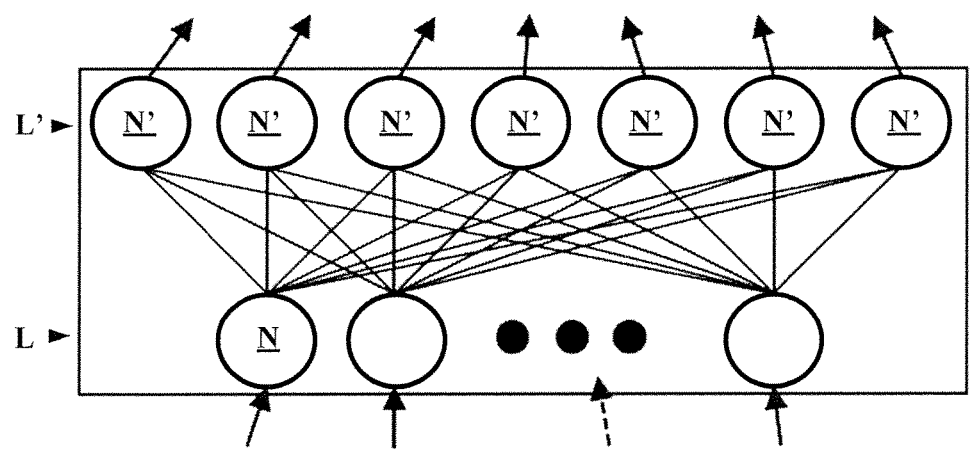
FIG. 2A shows a LLR/state block for 1 DNN: LLRs are from the trellis-detector.
FIG. 2B shows a LLR/state block for 8 DNNs. LLRs are from the trellis-detector.
FIG. 3 illustrates interconnections between two fully connected layers in a fully connected neural network architecture.

In this second method (i.e., for 1DMR), the $LLR_{b_j}$ vector provided to DNN has its central three elements equal to the level shifted (to ±1) three bit binary representation $[u_0, u_1, u_2]$ of the branch index j, and the other elements are unchanged from those in $LLR_b$. The LLR input vectors for the two methods employed to interface trellis-based detector to DNN are as shown in FIG. 2. FIG. 2A shows the LLR input vector for a 1 DNN method and FIG. 2B shows an LLR input vector for the method of 8 DNNs, $L_0$-$L_2$ and $L_6$-$L_8$ are LLRs from the BCJR, branches are specified by a fixed value of vector $[u_0, u_1, u_2]$. For the 8 DNNs method, in general, when particularly using the BCJR trellis-detector, BCJR trellises with $N_{br}$ branches per stage require $N_{br}$ separate DNNs. For TDMR, there are $N_b = 2^{N_r \times (I+1)}$ DNNs, one per trellis branch. Similar to the 1DMR processing, the $N_r \times (I+1)$ central bits of the $LLR_b$ input arrays (which are of size $N_r \times N_w$) are set to the binary representation of the trellis branch index, to form the input array for the DNN dedicated to (and trained for) a specific trellis branch.

To illustrate the design of the deep neural network-based media noise predictors disclosed herein, three architectures are investigated. The three DNN media noise predictor architectures include, but are not strictly limited to, often a traditional fully connected deep neural network (FCDNN) or a convolutional neural network (CNN) and in limiting cases, a long short-term memory (LSTM).

In the first architecture of a FCDNN, each FCDNN layer includes of a hidden layer and an output layer. Each output layer node is connected to a node in the next FCDNN layer's hidden layer through a non-linear activation function. FIG. 3 illustrates such connection between two fully connected layers, wherein each node (e.g., N in one layer L is connected to every node (N' in an immediately adjacent layer L'). Because layers are fully connected, to form each training example, we vectorize a 3×15 window of filtered readings into a 45×1 column vector. The ensemble of all the column vectors comprises the input stage.

In each fully connected stage, a fully connected layer with a number of hidden nodes is followed by a ReLU layer for network activation. Each node in the fully connected layer applies the affine function y=w_x+b to its input x, where w; b are trainable parameters. The weights and biases between each fully connected layers are the learnables to train and optimize in the FC-DNN. The ReLU layer utilizes, for example, a ReLU function f(x)=max (0; x), a nonlinear activation function that generates sparsity, is easy to compute, and combats the vanishing gradient problem that occurs with the sigmoid activation function.

The output $o_j$ of a given output layer's node j is computed from its hidden layer node inputs $x_i$ as $o_j = f(z_j)$, where $z_j = \Sigma_i w_{ij} x_i + b_j$, and the $w_{ij}$ and bj are trainable weights and a trainable bias term, respectively. The function $f(z)$ is the rectified linear unit (ReLU) function $f(z) = \max(0, z)$. Other modified ReLU-like functions that work well with the stochastic-gradient-descent method of training DNNs can also be used.

In the second architecture of a CNN, each convolutional layer has a bank of trained finite length filters connected to an output layer. Each output layer node has a trainable bias term, and is connected to the next convolutional layer through a ReLU function, or modified versions of a ReLU function, as understood by those of ordinary skill in the art and as stated above. Both of the FCDNN and the CNN architectures can perform feature extraction to facilitate media noise prediction.

In the third architecture of long short-term memory (LSTM), there exists an input stage, seven stacks of LSTM stages (LSTM stages #1 through #7), and an output stage, with a total of 11 layers. Each LSTM stage includes of a bidirectional LSTM (BLSTM) layer, which is a hybrid version of LSTM and bidirectional RNN (BRNN). Bidirectional dependencies can be learned because the network has access to the complete sequence at each time step.

For the trellis-DNN turbo detector, the FCDNN and CNN architectures are further investigated. The DNNs process their input data in a sliding block manner. To estimate the kth media noise sample $\tilde{n}_{m_k}$, the lowest input layer of each DNN accepts a block $LLR_{b_k}$ of $N_i$ trellis-based detector output LLRs as shown in FIG. 1B and FIG. 1C. $N_i$ filtered readings $y_k^{(1)}$, and $N_i$ raw second readings $r_k^{(2)}$ where $N_i$ is an odd number, and the kth noise estimate corresponds to the middle element of the $N_i$ elements in each block; for the examples included herein, $N_i$=9. To estimate the (k+1)th media noise sample, each of the input vector data blocks of the LLRs is shifted by exactly one sample into the future.

In particular, for the 1DMR architecture of a trellis-DNN turbo detector shown in FIG. 1B, the input layer to the DNN media noise predictor 8 consists of a concatenation of the 1×$N_w$ row vectors of samples corresponding to each of the input variables of a 2D stack of 1D layers, where each 1D layer corresponds to one of the input variables $y^{(1)}$, $LLR_b$, $r^{(2)}$, any additional unfiltered samples $r^{(j)}$, j>2 up to n, and if there are additional DNN iterations, LLR. For each of these input variable vectors of length $N_s$, a sliding window of length $N_w$ moves one sample at a time from the first $N_w$ samples in the vector to the last $N_w$ samples. At each window position, the DNN media noise predictor 8 forms a media noise estimate $\tilde{n}_m$ that corresponds to the bit in the center of the $N_w$ samples.

In particular, for the TDMR architecture of trellis-DNN turbo detector shown in FIG. 1C, the input layer to the DNN media noise predictor 28 for each input variable is a 2D window of size $N_t \times N_w$. When only one DNN is used, the DNN estimates the $N_t$ media noises, one per track, corresponding to the midpoint of the $1 \times N_w$ window on each track. The 2D window moves down-track one sample at a time in a sliding block manner. When $N_t$ DNNs are used, then each DNN estimates only one media noise corresponding to the center tap of the $1 \times N_w$ window on its corresponding track.

Figure 4:
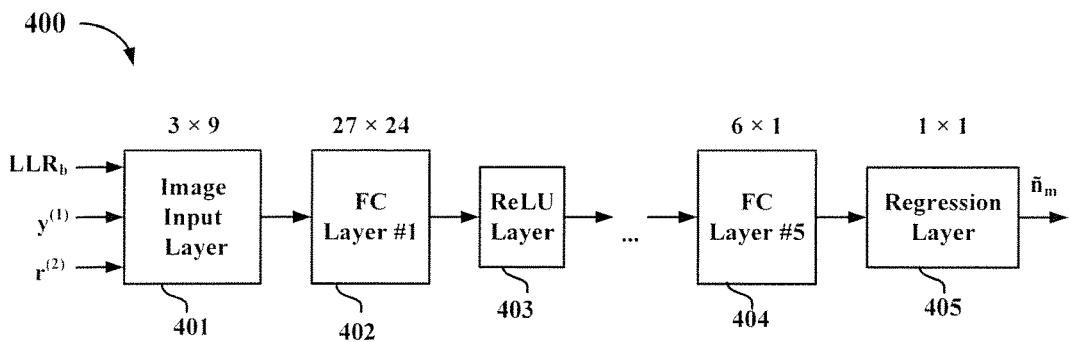
FIG. 4 illustrates the fully connected neural network architecture for a trellis-DNN turbo detector.

Turning to FIG. 4 which shows the architecture design for the FCDNN based media noise predictor 400. A FCDNN is a modular layer design for which the network depth is chosen so as to optimize the model. Every node in each fully connected layer is connected to all the nodes in the previous layer. The design architecture of FCDNN included herein has 11 layers.

The first layer is an input image layer 401 in which data that is normalized to have zero mean and unit variance enters. The vectors of $N_w$ samples for each input variable in the input image layer are serially concatenated into a $1 \times N_v$ row vector, where $N_v$ is the number of input variables. For the embodiments tested herein, the input layer 401 has size 27 when there are three (i.e., $LLR_{b_k}$, $y_k^{(1)}$ and $r_k^{(2)}$) length-9 input data blocks; the input layer 401 has size 18 when only $LLR_{b_k}$ and $y_k^{(1)}$ are used as inputs. The output of this layer feeds the next layer. The next layer is a fully connected layer. The network architecture presented herein has 5 fully connected layers. In FIG. 4, two of these 5 layers are shown as FC layer #1 402 and FC layer #5 404. For the three input data blocks, the sizes of fully connected layers 1 through 5 for the embodiment herein are equal to [27×24], [24×18], [18×12], [12×6], and [6×1]; for two input data blocks, the sizes for the embodiment herein are [18×15], [15×12], [12×9], [9×6], and [6×1]. It is to be noted here that the number of layers and the layer sizes are unique only to the examples given herein, but, it is to noted that other numbers of layers and layer sizes can also be used with this invention without departing from the scope and spirit of the invention.

After each fully connected layer except the last one, there exists a ReLU (note: throughout herein, other modified ReLU versions can also be used as stated above) activation function layer 403 as shown in FIG. 4. The ReLU function of the ReLU activation function layer 403 assists the model to converge with greater acceleration. After the last fully connected layer FC layer #5 404, there should not be any ReLU layer since thresholding the last layer's output will give a poor estimate of the true media noise, which is a real number that can take positive or negative values. The last layer is the regression layer 405, which predicts the responses of the model. The regression loss function is 0.5× the mean squared error between the training label media noise and the DNN prediction of the media noise.

Figure 5A:
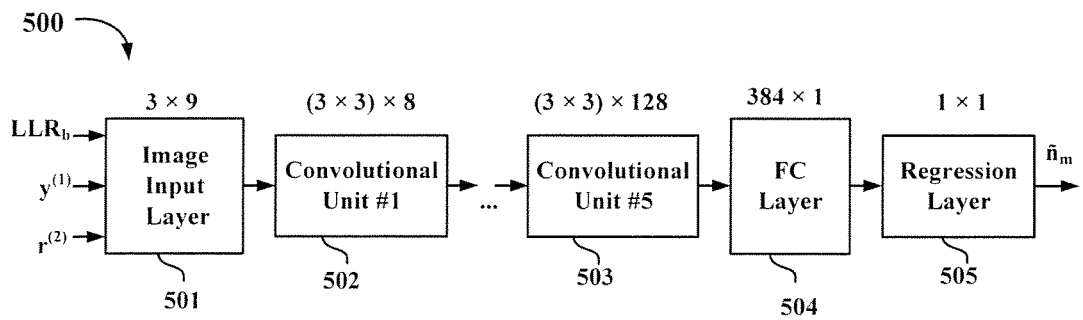
FIG. 5A illustrates the convolutional neural network architecture for trellis-DNN turbo detector.

FIG. 5A shows the CNN architecture designed herein referenced by numeral 500. The CNN is similar to the FCDNN in that every node receives some input and predicts the output with non-linearity. The CNN architecture design included herein contains, for example, 18 layers. These layers are categorized as one input image layer 501, 5 convolutional units, and one output layer 505. After normalizing the raw data received from the other blocks to have zero mean and unit variance, the system passes them to the input image layer 501. For the embodiments tested herein, the 2D input image layer 501 of FIG. 5A is of size 27, and includes three rows consisting of nine samples from each of the three input blocks $LLR_{b_k}$, $y_k^{(1)}$ and $r_k^{(2)}$. When $r_k^{(2)}$ is not included as an input, the input layer is of size 18 and includes two rows of nine samples each from $LLR_{b_k}$ and $y_k^{(1)}$.

Figure 5B:
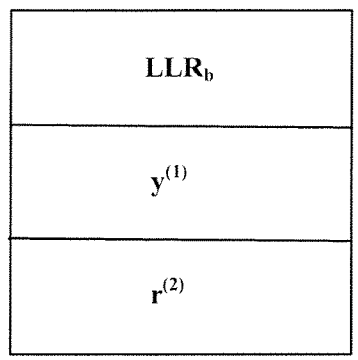
FIG. 5B shows a graphic representation of a 2D input image layer of convolutional neural network for trellis-DNN turbo detector for 1DMR as disclosed herein.

The CNN architecture operates by applying a bank of finite impulse response (FIR) filters to the data, and outputting the results to subsequent convolutional layers. The conventional approach with 1D input data is to have each layer in the CNN consist of a bank of 1D filters. The CNN architecture 500 employed herein particularly for the 1DMR architecture of trellis-DNN turbo detector shown in FIG. 1B exploits the 2D spatial correlation between the input variables by stacking them into an $N_v \times N_w$ 2D array, and employing trained 2D convolutional filters in each CNN layer. This approach is illustrated in FIG. 5B for the three input variables $LLR_b$, $y^{(1)}$ and $r^{(2)}$. The simulations included in the embodiment herein, show that this approach provides lower BERs than the more conventional approach of using 1D FIR filters in the CNN layers. In addition, unlike CNNs commonly used in image or speech recognition applications, the simulations herein do not subsample the output of any given CNN layer before passing it to the next layer an achieve optimum results.

Figure 5C:
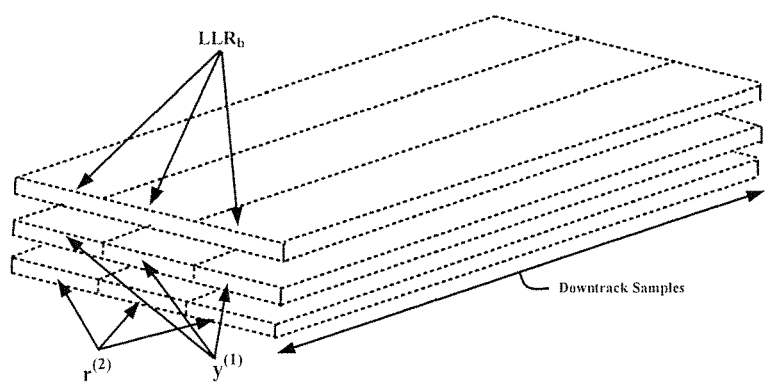
FIG. 5C shows a graphic representation of a 3D input image layer of a convolutional neural network for a trellis-DNN turbo detector for TDMR as disclosed herein.

In the CNN architecture 500 employed herein, particularly for the TDMR architecture of the trellis-DNN turbo detector shown in FIG. 1B, has the input layer of CNN 501 for each input variable as a 2D window of size $N_t \times N_w$. The 2D windows are stacked into a 3D array of size $N_v \times N_t \times N_w$. Three such layers are as shown in FIG. 5C. The three layers are the trellis detector output LLR probabilities $LLR_b$, the filtered output $y^{(1)}$ and the sample $r^{(2)}$ of the readback vector r. FIG. 5C shows the 3 layers for the case, $N_v=3$, $N_t=3$ and $N_w=9$. In the simulations herein, $N_v=3$ for the 1st decoding pass of DNN and $N_v=4$ for the second decoding pass of DNN, $N_t=3$ and $N_w=9$. Further, 3D convolutional filters were used at each CNN layer, so as to exploit the 3D spatial correlation between the stacked 2D input layers. The same LLR input formats and normalization were used for the TDMR architecture of DNN as for the 1DMR architecture of DNN, with the LLR probability format giving the best performance (lowest BER out of the BCJR, and highest areal density).

Every convolutional unit includes 3 layers: convolutional layer, batch normalization layer, and ReLU layer. Two of these convolutional units are shown in FIG. 5A, Convolutional Unit #1 502 and Convolutional Unit #5 503. The convolutional layer slides the filter over the input data, and the batch normalization layer normalizes the data to speed up network training and reduce sensitivity to the initial conditions (of the filter coefficients and interconnection weights) in the layers. The output layer is a regression layer 505. Every convolutional layer has three properties: the filter length, the filter width, and the number of filters which is called the number of channels. In CNNs designed for three rows of input, all convolutional layers employ convolutional filters; for two-row-input CNNs the filters are of size [2×3]. The number of channels in units 1 through 5, illustratively, for example, can be equal to 8, 16, 32, 64, and 128 respectively.

Simulation Results

The trellis-DNN turbo detector was tested via the BCJR detector was utilized for 1DMR, but it is to be appreciated that the simulation results are equally applicable for TDMR, as discussed below. Simulations were carried out using the BCJR-DNN turbo detector on two different GFP waveform data sets for both FCDNN and CNN architectures. Simulation results presented herein also include four scenarios for the DNN input features. In all the results presented herein, one turbo-loop between the BCJR and the DNN is performed. In this turbo-loop, the BCJR initially assumes that the media noise is zero, and computes an initial set of output LLRs $LLR_{b_k}$ which are passed to the DNN. The DNN then computes media noise estimates $\tilde{n}_{m_k}$ and passes them back to the BCJR. The BCJR is then run a second time using the DNN's media noise estimates to obtain a lower BER. The LLR outputs of the second pass through the BCJR are set as threshold and used to compute the detector's BER.

A. Data Sets

Referring to the results in Table 1 and Table 2, as detailed below, two GFP waveform data sets, both with 11 nm BL are used. The first set has TP=48 nm and GPB=9.33; the second has TP=27 nm and GPB=5.25. Each block in each data set has 5×$N_s$ input bits, where $N_s$=41206. The central three tracks for each data set have two readings per bit, i.e. 3×2$N_s$ readings per block. The 1D detectors use only the central track in the GFP waveforms for training and testing purposes herein. 16 GFP blocks are used as training data set to train the DNNs and the 1D PDNP is used as a comparison baseline for the results. Another distinct set of 16 blocks is used as the test data set to generate simulation results of BER of the detector as presented in Table 1 and Table 2.

B. Input Scenarios

Simulation results presented herein include four scenarios for the DNN input features. For all scenarios, the data is normalized by subtracting the mean and dividing by the standard deviation for each feature, so as to send unbiased data to the DNN. In the first, the DNN inputs are the signs of the BCJR detector's output LLRs and the sequence $y_k^{(1)}$. In the second, the LLR signs are replaced with their corresponding probabilities using the standard exponential formula as below, $P(u=\pm 1)=\exp(L(u))/(1+\exp(L(u)))$, where the LLR $L(u)$ of coded bit u is computed as $L(u)=\log[P(u=+1|y^{(1)})/P(u=-1|y^{(1)})]$. The LLR probabilities not only give the estimated bit but also the estimation's reliability. Using the LLR probabilities as DNN inputs gives better media noise estimates than using the signed LLR values due to the non-linear scale inherent in the LLRs, as opposed to the linear scale of their associated probabilities. The other two scenarios utilize the second samples $r_k^{(2)}$ of the raw GFP readings. For the third scenario, the signs of the LLRs, $y_k^{(1)}$ and $r_k^{(2)}$ are assigned as the DNN input features. In the fourth scenario, the LLR probabilities $y_k^{(1)}$ and $r_k^{(2)}$ and r are used.

C. BER Results

Figure 6:
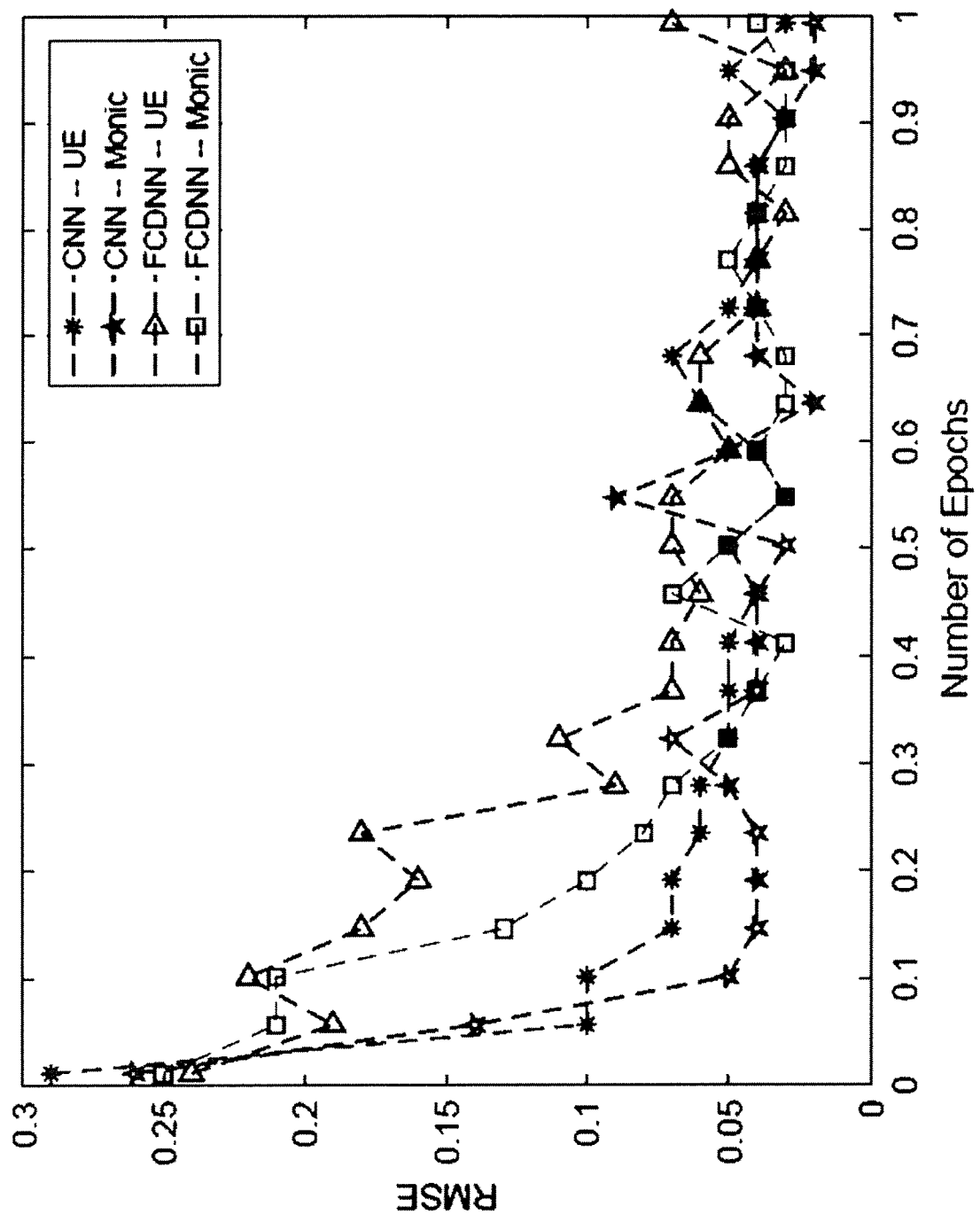
FIG. 6 illustrates learning curves for the FCDNN and CNN on the 48 nm TP data set, when the inputs include the LLR probabilities, $y_k^{(1)}$ and $r_k^{(2)}$.

FIG. 6 shows the FCDNN and CNN learning curves (i.e., root MSE (RMSE) versus number of training epochs) for the case when 1 DNN has LLR probabilities, $y_k^{(1)}$ and $r_k^{(2)}$ as inputs. In the learning curves showed in FIG. 6, one epoch refers to one pass through all 16 training data blocks. The points of the curve indicate separate iterations; an iteration refers to an instance of stochastic-gradient-descent based on a gradient estimate derived from a small subset of the training data.

FIG. 6 shows results for three-tap unit energy (UE) and monic PR masks. The convergence speed is fastest and the final achieved RMSE is lowest, for the CNN with monic mask, followed by the CNN with UE mask, the FCDNN with monic mask, and the FCDNN with UE mask. The first three of these converge within one epoch, whereas the FCDNN with UE mask takes little longer to converge. The learning curve convergence results are consistent with the BER results presented in Table 1 and Table 2 below.

TABLE 1

Simulations of PDNP and DNN/BCJR detectors at TP 48 nm.

| Method | Input | PR Mask | BER No AWGN | | BER SNR 20 dB | |
|---|---|---|---|---|---|---|
| PDNP | Single Sample | UE | 4.55e-4 | | 7.54e-4 | |
| | | Monic | 5.55e-4 | | 5.76e-4 | |
| | Double Sample | UE | 7.54e-4 | | 1.32e-3 | |
| | | Monic | 7.68e-4 | | 9.01e-4 | |
| DNN | | | 8 DNNs | 1 DNN | 8 DNNs | 1 DNN |
| FC | Sign[L], $y^{(1)}$ | UE | 1.10e-3 | 1.02e-3 | 3.59e-3 | 3.38e-3 |
| | | Monic | 2.84e-4 | 2.81e-4 | 7.34e-4 | 7.24e-4 |
| | Pr[L], $y^{(1)}$ | UE | 7.58e-4 | 7.22e-4 | 2.38e-3 | 2.42e-3 |
| | | Monic | 2.29e-4 | 2.18e-4 | 5.39e-4 | 5.51e-4 |
| | Sign[L], $y^{(1)}, r^{(2)}$ | UE | 2.93e-4 | 4.08e-4 | 3.38e-4 | 3.61e-4 |
| | | Monic | 2.50e-4 | 2.79e-4 | 2.91e-4 | 3.85e-4 |
| | Pr[L], $y^{(1)}, r^{(2)}$ | UE | 2.58e-4 | 2.34e-4 | 3.29e-4 | 2.61e-4 |
| | | Monic | 2.09e-4 | 2.09e-4 | 2.64e-4 | 2.55e-4 |
| CNN | Sign[L], $y^{(1)}$ | UE | 3.06e-4 | 3.52e-4 | 7.72e-4 | 9.57e-4 |
| | | Monic | 1.58e-4 | 1.67e-4 | 4.14e-4 | 4.40e-4 |
| | Pr[L], $y^{(1)}$ | UE | 2.93e-4 | 2.85e-4 | 7.77e-4 | 7.62e-4 |
| | | Monic | 1.65e-4 | 1.65e-4 | 4.41e-4 | 4.32e-4 |
| | Sign[L], $y^{(1)}, r^{(2)}$ | UE | 1.87e-4 | 2.28e-4 | 2.08e-4 | 2.43e-4 |
| | | Monic | 1.53e-4 | 1.70e-4 | 1.97e-4 | 2.09e-4 |
| | Pr[L], $y^{(1)}, r^{(2)}$ | UE | 1.85e-4 | 1.64e-4 | 2.25e-4 | 2.14e-4 |
| | | Monic | 1.52e-4 | 1.62e-4 | 2.02e-4 | 2.00e-4 |

Table 1 summarizes the results for the TP=48 nm data set. The block of LLR inputs $LLR_{b_k}$ to the DNN from the BCJR is indicated by L in Table 1. The table contains BER performance of the proposed BCJR-DNN detector to that of a 1D PDNP BCJR detector with 128 states, corresponding to I=2, L=4, and Δ=1. The 1D PDNP takes its input from the same length 15 MMSE filter, with the same PR target has that used with the BCJR-DNN detector. The PDNP's pattern vector length of I+1+L+Δ=8 bits is about equal to the DNN's channel input $y^{(1)}$ length of 9 samples.

Averaged input $r_k^{avg}=(r_k^{(1)}+r_k^{(2)})/2$ is computed for PDNP to exploit both sample sequences $r_k^{(1)}$ and $r_k^{(2)}$ without doubling the number of state bits. The BCJR-PDNP system including the MMSE filter, the PR mask and the trained PDNP coefficients is designed for the input $r_k^{avg}$. The row labeled 'Doubled Samples' under the PDNP method in Table 1 contains the results for the BCJR-PDNP system. The BER for the double sample case is higher in all cases than that of the single sample case that uses $r^{(1)}$. $r^{(2)}$ is not co-located with $r^{(1)}$, thus averaging it with $r^{(1)}$ does not give true noise averaging. In addition, the location of $r^{(2)}$ between the bits introduces additional down track ISI into the average of the two readings. Thus, the 1D-PDNP cannot exploit additional samples without expanding the number of trellis states, whereas the trellis-DNN detector benefits from the extra sample $r^{(2)}$.

The GFP data contains no read-head electronic AWGN, i.e., $n_e(k)=0$ in equation (1). The column labeled 'BER No AWGN' in Table 1 reports results for this case. The column labeled 'BER SNR 20 dB' in Table 1 reports results when non-zero AWGN $n_e(k)$ at an SNR of 20 dB is added to both sample sequences $r_k^{(1)}$ and $r_k^{(2)}$. The SNRs for the cases when the PDNP or DNN uses $r_k^{(1)}$ or both samples $r_k^{(1)}$ and $r_k^{(2)}$ are computed as $$SNR_1 = 10\log_{10}\left(\frac{1}{\sigma_e^2}E\left[(r_k^{(1)})^2\right]\right) \quad (2)$$

$$SNR_2 = 10\log_{10}\left(\frac{1}{\sigma_e^2}\left[E(r_k^{(1)})^2 + (r_k^{(2)})^2\right]\right), \quad (3)$$

where $SNR_1$ and $SNR_2$ indicate the single and double sample cases, and $\sigma_e^2$ is the AWGN variance.

From the simulation results in Table 1, it is observed that for the zero AWGN results, except for a few UE mask cases, the BCJR-DNN detector achieves lower BERs than the PDNP detector. The BCJR-DNN detector's lowest BER of 1.52e-4 occurs in the last row of the table with the monic mask, 8 CNN noise predictors, and inputs of the LLR probabilities Pr[L] and $y_k^{(1)}$ and $r_k^{(2)}$. This BER results is surprisingly and unexpectedly 0.334×the PDNP's lowest BER of 4.55e-4, which is achieved with the UE mask. The next lowest BER of 1.62e-4 occurs with monic mask, 1 CNN noise predictor, and inputs of the LLR probabilities Pr[L] and $y_k^{(1)}$ and $r_k^{(2)}$. This BER results is surprisingly and unexpectedly 0.356× the PDNP's lowest BER.

From the results discussed herein, it is observed that for the BCJR-DNN detector, the monic PR mask gives lower BER than the UE PR mask in all cases. For the 1D PDNP detector, the UE PR mask gives the lowest BER. Using LLR probabilities in the BCJR-DNN detector always gives lower BERs than using LLR signs. Adding the second GFP sample $r_k^{(2)}$ to the DNN inputs further lowers the BER. This reduction in BER is less in case of monic PR mask as compared to UE PR mask.

From the results discussed herein, it is further observed that for the BCJR-DNN detector, using 8 DNNs has little to no advantage over 1 DNN. Although, in particular scenarios using 8 DNNs gives a significant BER reduction. For example, when used with the UE PR mask, LLR signs and both GFP input samples; when used with monic PR mask achieves the lowest overall BER as seen from the simulation results.

From the results discussed herein, it is further observed that for the BCJR-DNN detector, the BERs for AWGN at 20 dB SNR are higher than those with zero AWGN. The only exception to this case is observed with one UE mask FCDNN system that uses the sign of the LLR and both GFP readings. The non-linear sign operation benefits from some amount of AWGN. In some simulation scenarios it is observed that with the 20 dB SNR results are similar to those of the zero AWGN case: the lowest CNN (with 1 CNN and 8 CNNs) BER of 1.97e-4 is about 0.342× the lowest PDNP BER of 5.76e-4.

Table 2 shown below summarizes the simulation results for the TP=27 nm data set. In particular, Table 2 shows significantly higher ITI with reduced TP, which neither ID detector can explicitly take into account. This leads to higher BERs throughout Table 2 as compared to Table 1. The simulation results observed in both result tables follow a similar trend except that the zero-AWGN BCJR-DNN detector's BER is lower than the PDNP's BER for the monic PR mask CNN cases (last and second to last row in Table 2); and the monic PR mask 8-FCDNN case (sixth FCDNN row in Table 2). It is observed that the lowest BCJR-DNN BER is about 0.942× the PDNP's lowest BER for zero AWGN, and about 0.754× lower for AWGN at 20 dB SNR.

TABLE 2

Simulations of PDNP and DNN/BCJR detectors at TP 27 nm.

| Method | Input | PR Mask | BER No AWGN | BER SNR 20 dB |
|---|---|---|---|---|
| PDNP | Single Sample | UE | 9.75e-3 | 1.58e-2 |
|  |  | Monic | 7.12e-3 | 1.12e-2 |
|  | Double Sample | UE | 1.25e-2 | 2.35e-2 |
|  |  | Monic | 8.75e-3 | 1.73e-2 |

TABLE 2-continued

Simulations of PDNP and DNN/BCJR detectors at TP 27 nm.

| DNN |  |  | 8 DNNs | 1 DNN | 8 DNNs | 1 DNN |
|---|---|---|---|---|---|---|
| FC | Sign[L], $y^{(1)}$ | UE | 2.08e-2 | 2.16e-2 | 3.22e-2 | 3.64e-2 |
|  |  | Monic | 7.30e-3 | 7.39e-3 | 1.18e-2 | 1.26e-2 |
|  | Pr[L], $y^{(1)}$ | UE | 1.86e-2 | 1.67e-2 | 2.83e-2 | 2.90e-2 |
|  |  | Monic | 7.20e-3 | 7.25e-3 | 1.19e-2 | 1.18e-2 |
|  | Sign[L], $y^{(1)}, r^{(2)}$ | UE | 8.52e-3 | 9.96e-3 | 1.13e-2 | 1.24e-2 |
|  |  | Monic | 7.08e-3 | 7.22e-3 | 9.51e-3 | 1.03e-2 |
|  | Pr[L], $y^{(1)}, r^{(2)}$ | UE | 8.36e-3 | 8.44e-3 | 1.10e-2 | 1.13e-2 |
|  |  | Monic | 7.12e-3 | 7.14e-3 | 9.60e-3 | 9.58e-3 |
| CNN | Sign[L], $y^{(1)}$ | UE | 1.14e-2 | 1.21e-2 | 1.94e-2 | 2.17e-2 |
|  |  | Monic | 6.92e-3 | 7.08e-3 | 1.16e-2 | 1.16e-2 |
|  | Pr[L], $y^{(1)}$ | UE | 1.10e-2 | 1.14e-2 | 1.86e-2 | 1.90e-2 |
|  |  | Monic | 6.96e-3 | 6.99e-3 | 1.15e-2 | 1.15e-2 |
|  | Sign[L], $y^{(1)}, r^{(2)}$ | UE | 7.72e-3 | 8.68e-3 | 9.97e-3 | 1.07e-2 |
|  |  | Monic | 6.74e-3 | 7.06e-3 | 9.18e-3 | 9.66e-3 |
|  | Pr[L], $y^{(1)}, r^{(2)}$ | UE | 7.74e-3 | 7.78e-3 | 9.84e-3 | 9.87e-3 |
|  |  | Monic | 6.71e-3 | 6.83e-3 | 8.45e-3 | 9.16e-3 |

In a second iteration between the BCJR and the noise-prediction CNN, CNN is trained with the BCJR output LLRs that result from the first-iteration CNN's noise prediction and with $y_k^{(1)}$ and $r_k^{(2)}$. The BCJR uses the second-iteration CNN's noise prediction to derive new LLR estimates of the data bits.

Computational Run Time and Complexity Results

As part of the simulations carried out herein, the run time per input bit is measured by running 16 test blocks on the same CPU for the PDNP, BCJR-FCDNN and BCJR-DNN detectors. Both BCJR-DNN detectors use 1DNN for these tests. It is observed from these tests that PDNP required 774 µs per bit, the BCJR-CNN required 89.6 µs per bit, and the BCJR-FCDNN required 43.7 s per bit. Surprisingly and unexpectedly, it is seen that both BCJR-DNN detectors runs substantially faster than a conventional PDNP. The best performing BCJR-DNN detector with 8 CNNs requires 0.731 times the per bit running time (PBRT) of a conventional PDNP detector.

TABLE 3

Computational complexity for BCJR-PDNP, BCJR-1 CNN and BCJR-8 CNNs.

| Method | mul/div | add/sub | exp/log | sqrt |
|---|---|---|---|---|
| PDNP | 141,168 | 41,347 | 257 | 256 |
| 1 DNN | 12,953 | 11,087 | 18 | 16 |
| 8 DNNs | 101,013 | 86,528 | 18 | 16 |

Table 3 shows computational complexity figures in terms of counts of arithmetic operations and exp/log per input sample. The computational complexity of the BCJR-DNN detector is about $\frac{1}{10}^{th}$ that of a conventional 1D-PDNP system that employs a BCJR detector. The complexity of the BCJR algorithm grows as the square of the number of states, due to double summation over the state variables required to compute the LLRs. The higher complexity of the BCJR-PDNP is due to its trellis having 32× the number of states of the trellis used in the BCJR-CNN system. Using a SOVA detector further reduces the complexity as SOVA is less computationally complex than BCJR.

E. Areal Density Gains

From the simulations using BCJR-DNN architecture with the LDPC channel decoder for 1DMR, it is observed that the BCJR-DNN architecture achieves an areal density gain of 1.6% over 1D-PDNP with one iteration of the turbo-loop iterative decoding and of 2% with two iterations of the turbo-loop iterative decoding, wherein the second iteration includes a second CNN media noise estimation. These simulations were done on micro-magnetic simulation based waveforms, which are the most accurate form of HDD waveform simulations and were done at grain and bit densities typical of current generation HDDs. Assuming conventional 1D-PDNP having density gains of about 5% over conventional trellis-based ISI equalization, 1.6% to 2% areal density improvement of trellis-DNN detector over conventional PDNP are significant.

From the simulations using BCJR-DNN architecture for TDMR, it is observed that the BCJR-DNN architecture achieves an areal density of 3.2 Terabits/in$^2$ (Tb/in$^{(2)}$) on a data set with an 18 nm track pitch and a magnetic grain density of 11.4 Teragrains/in$^2$. It is to be stressed that the 3.2 Tb/in$^2$ is higher than any currently published value for GFP data with grain density of 11.4 Teragrains/in$^2$. This is more than a 26% areal density gain over conventional 1D-PDNP with 3 times the data throughput rate and more than a 43% areal density gain over 2D-PDNP with 1.5 times the data throughput rate, which is surprisingly and unexpectedly a significant improvement over current state of the art architectures.

EXAMPLE

Figure 7:
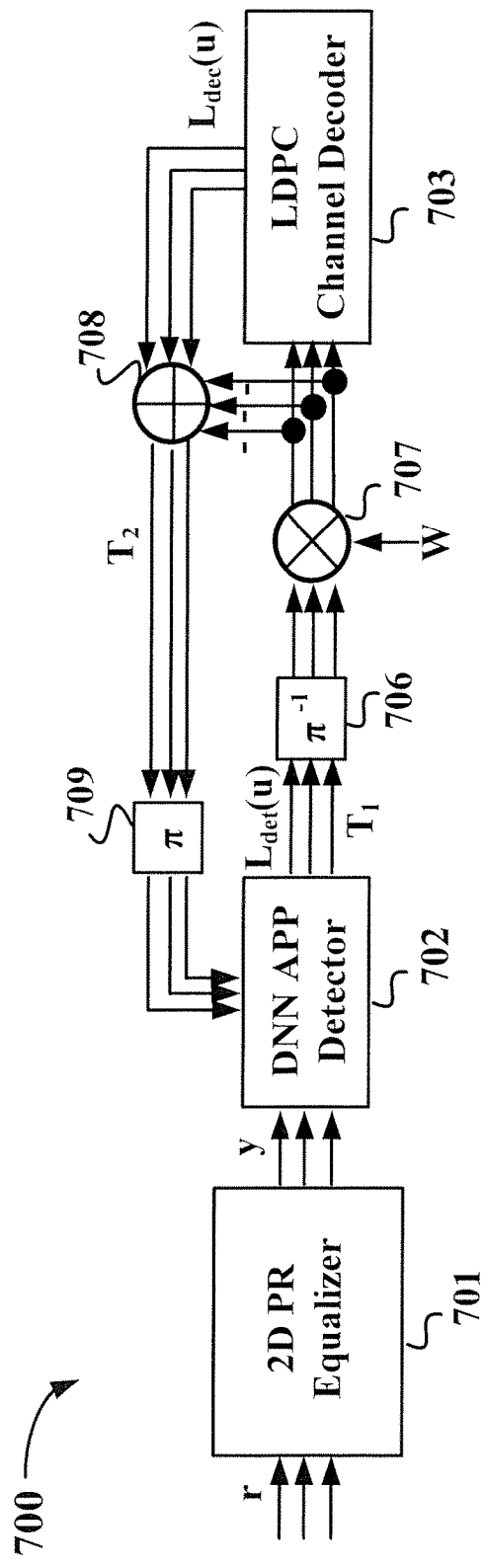
FIG. 7 represents the block diagram for the DNN based APP detection system.

Another example of the embodiment herein is a DNN based a posteriori probability (APP) detection system to be used as a TDMR detection system. FIG. 7 shows a block diagram representation of the DNN based APP detection system referenced by numeral 700. The system input includes of a three-track GFP readings r. Table 4 below shows the best fit normalized 3×3 ISI convolutional masks for two GFP data sets generated to carry out simulations for this example. These ISI masks are estimates of the 2D channel response used to simulate these two data sets, and are estimated using least squares method. For GFP data set #1, the three-track readings have raw BERs of roughly 18.54%, 18.53% and 18.33%, under a hard decision with threshold 0. For GFP data set #2, the raw BERs are 16.38%, 16.41% and 16.32%.

TABLE 4

Normalized 3 × 3 convolutional mask for estimating 2D-ISI

| GFP data set #1 | | | GFP data set #2 | | |
| --- | --- | --- | --- | --- | --- |
| 0.1163 | 0.2725 | 0.0462 | 0.0967 | 0.1742 | 0.0598 |
| 0.3087 | 1.0000 | 0.5264 | 0.3857 | 1.0000 | 0.5596 |
| 0.0959 | 0.4194 | 0.3628 | 0.0637 | 0.2397 | 0.2757 |

The three-track GFP readings r which is input to the system 700 is first pre-processed by a 2D 3-input-3-output linear PR equalizer 701. A 2D non-linear PR equalizer can also be used for the architecture shown in FIG. 1C. The linear equalizer h for the simulations herein is of length 3×15. h is applied on the raw GFP readings r in order to minimize the MSE between the filtered output h*r and desired output g*u, where g is a 2D 3×3 controlled PR target response, u is the block of three-track coded data bits and * indicates discrete 2D convolution. The linear PR equalizer 701 has output y. This output y is input to the DNN APP detector 702.

The detection system assumes a discrete time channel model for readback signal $r_k$:

$$r_k = (h_c * u)_k + n_{e,k} \quad (4)$$

where $h_c$ is the channel response, and $n_{e,k}$ represents the AWGN from reader electronics. The channel response is implicitly time varying and pattern dependent, because the channel is inherently nonlinear. This gives rise to pattern dependent media noise. The filtered readings y retain the effects of pattern dependent media noise, which is not removed by the linear equalizer h.

The DNN based APP detector 702 learns a general model to predict the coded bits u through an offline training process, i.e.

$$P(\hat{u}_k=1) = \mathcal{T}(y_k) \quad (5)$$

where $\mathcal{T}$ is a nonlinear transformation, $y_k$ is a 3×15 patch of filtered readings and $\hat{u}_k$ is the DNN's estimate of the center bit of the patch $y_k$. The binary GFP data bits u (±1) are the target bits that the DNN aims to output. They are available to the DNN as true labels during an initial offline training. As a result, the DNN detection process is essentially an instance of binary classification under supervised learning.

The DNN implemented herein for the DNN APP detector 702 of the system 700 consists of several layers. Interconnections between the layers are defined by functions. Parameters that specify these functions in the DNN include weights, biases, offsets and scales. Among these parameters, some are specified prior to training called as hyperparameters. The rest of the parameters are learnable parameters that are learned through training. The goal of these trainings is to optimize the learnable parameters so that they provide an accurate description of the input-output relationship between the bottom (input) layer and the top (output) layer of the DNN. The simulations herein arrive at optimized learnable parameters that yield the lowest detector BER and highest code rate and areal density.

The equalizer 701 of the system 700, as shown in FIG. 7, has output target g*u which is multi-level for each binary target bit. The DNN learns through training how to detect the binary target bit from the equalizer output. Each patch of filtered readings that the DNN uses to estimate one coded bit u is considered as one example, and it corresponds to one label. In the embodiment herein, one example consists of three tracks of filtered readings of length 15 (same length as the linear PR equalizer), and the label is the true value of the coded bit u in the center of the 3×15 example patch. After one example is formed, the next 3×15 samples are formed by moving down-track by one bit. The total number of examples per track is thus $N=N_b-14$.

An objective function, cross entropy loss herein, measures the error between the true label u and its DNN estimate û. The DNN minimizes this objective function through iterative gradient-based optimization during the training. At each training step, the DNN computes the gradient with respect to each of the learnable parameters over the training data set, and updates them in the direction of descending gradient. The optimized learnable parameters, along with the DNN structure, are stored at the end of the training. In real-time detection, the stored values are pre-loaded into the network and used to make predictions on a previously unseen test data set. Both training and test data are generated through the same GFP model parameters herein. This is justified by the fact that the read and write head and the recording media are fixed in a specific set of HDDs.

For the given block of filtered waveform inputs to the system 700 in FIG. 7, the DNN APP detector 702 outputs LLR $L_{det}(u)$ of each coded bit being ±1. The APPs detected LLR $L_{det}(u)$ are first deinterleaved using the inverse interleaver 706 and are then fed into a soft-input-soft-output channel decoder 703 as coupled to the DNN. The channel decoder 703 is an irregular repeat accumulate (IRA) low density parity check (LDPC) decoder for the embodiment herein. For the embodiment herein, the three tracks are processed independently by the LDPC channel decoder 703, assuming each track contains a separate codeword so as to be directed to a subtractor 708 (note inputs into subtractor 708 from prior to and after the soft-input-soft-output channel decoder 703) and interleaver 709 in the iteration back to the DNN APP detector 702. However, the invention can also be embodied with a single codeword spread over all the processed tracks. The DNN detector 702 and the LDPC channel decoder 703 exchange LLRs; the LLR magnitudes are capped at thresholds $T_1$ and $T_2$ at the outputs of the detector 702 and the decoder 703 respectively. A multiplicative weight w is applied to the LLRs passed by the DNN 702 to the LDPC channel decoder 703 after thresholding by the multiplier 707 in order to slow the convergence of the system and thereby avoid local minima in the channel decoder's BER.

For the TDMR APP detection example embodiment herein, the DNN architectures investigated are FCDNN, CNN and LSTM. For each type of DNN architecture, the layers are grouped and categorized into three functional stages, namely input stage, hidden stage and output stage. The input stage typically consists of an input layer. To account for the ITI and the correlation introduced by the linear PR equalizer in the DNN APP detector, the network input consists of three-track filtered readings of size 3×15 for the simulations herein. These readings are shaped in certain dimensions that are tailored to each of the three DNN network architectures. The true label for each example is the bit value at the center of the 3×15 patch. To estimate tracks 1 and 3, boundary track bits (tracks 0 and 4) was used to form the three-track external input.

The hidden stages are the main stages performing the function of the network. The function of the hidden stages depends on the type of DNN architecture. The output stage generates the probabilities that each bit belongs to each of the two classes and computes the network loss. It is made up of several layers that work jointly, and are identical in all the three DNN architectures.

For the embodiment herein, the FCDNN architecture implemented for the DNN APP detection system includes of an input stage, four stacks of fully connected stages #1 through 4 and an output stage, for a total of 12 layers. The connections between each node of a layer to every node in the immediately previous layer are specified by weights optimized during network training and can be zero. To form each training example, a 3×15 window of filtered readings is vectorized into a 45×1 column vector to accommodate the fully connected layers. The ensemble of all these column vectors comprises of the input stage. The number of hidden nodes in each hidden layer of the fully connected stages herein is 128-64-32-8. Decreasing number of nodes has been observed to give best results through the experiments herein as most of the information is available at the beginning of the network. It has been observed from the experiments that with a fixed input size say 45×1 herein, further increase in the depth of the DNN does not improve the network performance for a relatively short training time say 30 minutes. These observations lead to the conclusion that potential benefits could result from a deeper network for a longer input size and enough training time.

The output stage herein, consists of a fully connected layer with two hidden nodes namely a softmax layer and a classification layer. The fully connected layer combines all the learned features to make a classification. Its output size is equal to the number of classes of the data set K and K=2. The softmax layer applies the softmax function given below to the output $x_k$ of the fully connected layer, $$p_k = \exp(x_k)/(\Sigma_{j=1}^{K} \exp(x_j)), k=1,2 \qquad (6)$$

The softmax function produces a probability distribution $p_k$ over the K output classes. This is denoted as the soft information formed by the DNN detector, where $p_1$ is the probability that the bit is 0, and $p_2$ is the probability that the bit is 1.

The last layer in the output stage is the classification layer. The cross entropy loss is the most common loss function for binary classification problems. The classification layer computes the cross entropy loss as below, $$J = \Sigma_{i=1}^{N_{mb}} \Sigma_{k=1}^{K} 1(\hat{u}(i)=k) \times \ln(p_{ik}) \qquad (7)$$

where $N_{mb}$ is the number of training examples in the mini batch that the cross entropy is computed over, $1(\cdot)$ is the indicator function that is turned on when the equation $\hat{u}(i)=k$ is true, and $p_{ik}$ is the probability from the softmax layer that the $i^{th}$ example belongs to class k. Minimizing this objective function yields accurate and reliable classification.

Figure 8:
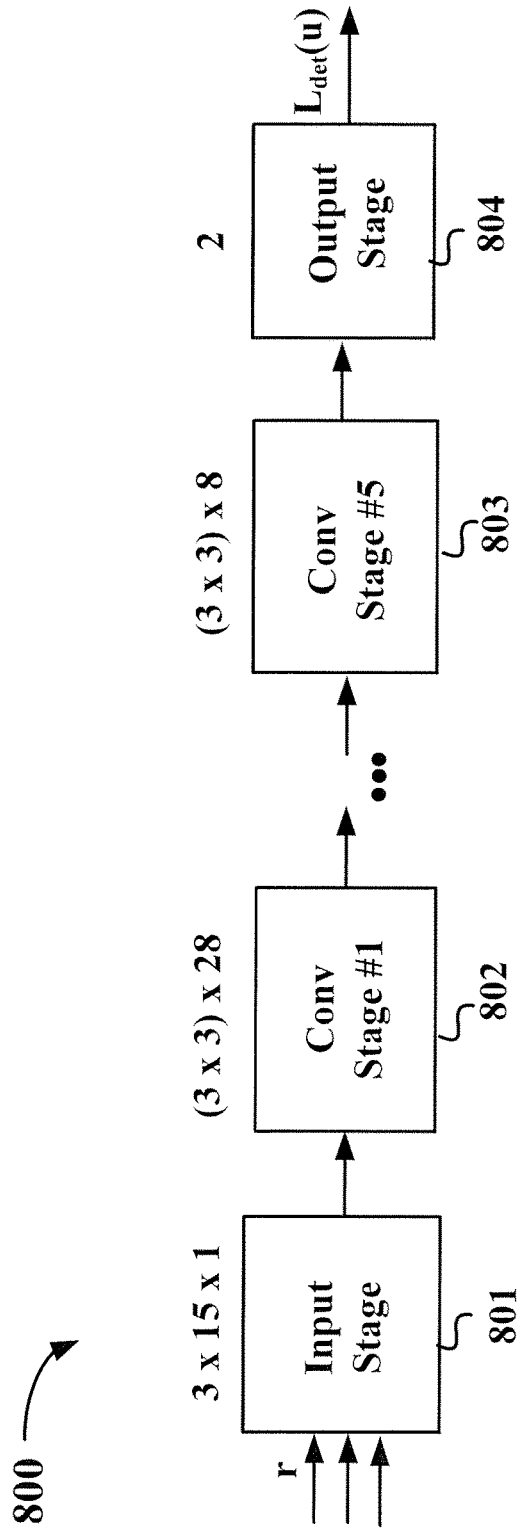
FIG. 8 illustrates the functional diagram of the convolutional neural network architecture for DNN based APP detection system.

The CNN architecture implemented for the DNN APP detection system includes of a first decoding pass and a second decoding pass. In particular, FIG. 8 shows the architecture of the CNN for the first decoding pass (referenced by numeral 800) carried out for the example embodiment herein. The CNN architecture 800 includes of an input stage 801, five stacks of convolutional stages and an output stage 804. The input stage is configured as an image input layer 801. Two of the five stacks of convolutional stages ae shown in FIG. 8, in particular, convolutional Stage #1 802 and Convolutional Stage #5 803. Each convolutional stage often comprises of three layers. The output stage 804 is identical to that of the FCDNN and includes of three layers, for a total of 19 layers. External input to the network is required to be in the form of a multidimensional array in order to be considered as an image.

Figure 9:
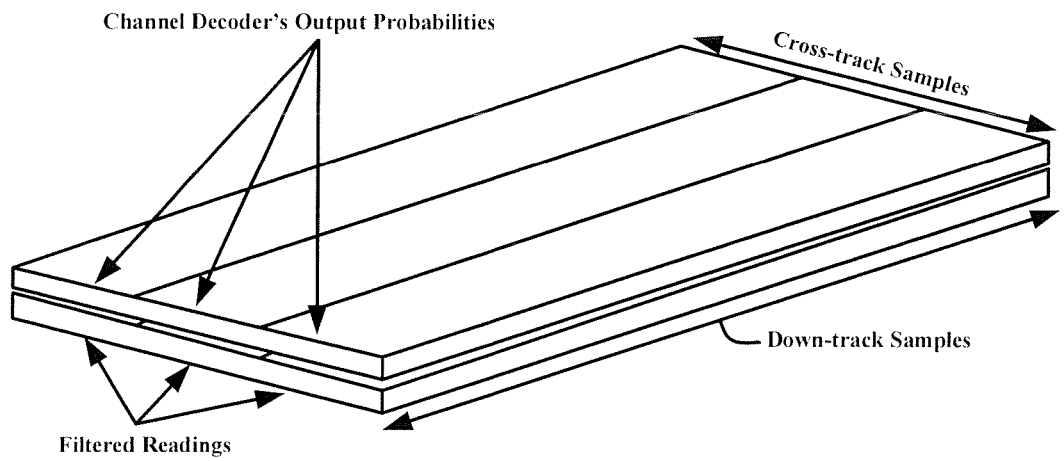
FIG. 9 shows a graphic representation of an input image layer of a convolutional neural network for a DNN based APP detection system as disclosed herein.

In the first decoding pass, the size of the image input layer 801 is [3×15×1] and the overall size of the entire input is [3×15×1×N]. In the second decoding pass, a priori information from the channel decoder becomes available, i.e., for each coded bit there exists an extrinsic soft estimate from the channel decoder. Therefore, for the embodiment herein, the input layer size is formed as [3×15×2], and the channel decoder's estimates are stored as a second image stacked on top of the first [3×15×1] image of filtered readings. This is illustrated in FIG. 9.

Figure 10:
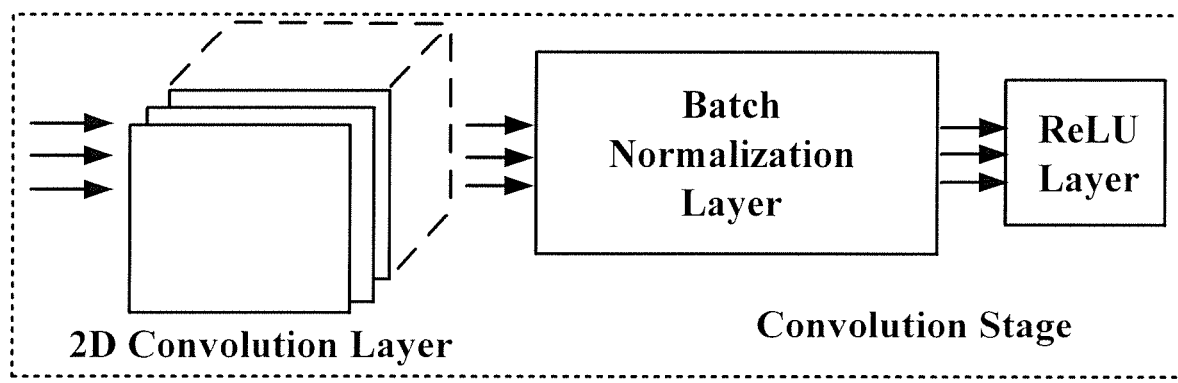
FIG. 10 shows the structure of a convolutional stage.

Several stacks of convolutional stages follow the input stage. The first decoding pass consists of five stacks of convolutional stages and the second decoding pass, consists of six stacks for the embodiment herein. FIG. 10 illustrates the structure of a convolutional stage. This stage consists of a 2D convolutional layer, a batch normalization layer and a rectified linear unit (ReLU) layer. Several sliding 2D convolutional filter banks, or kernels of size 3×3 are applied to the input layer of the 2D convolutional layer. Zero padding is applied to both the horizontal and the vertical input borders so that the output of the convolutional layer has the same size as its input. This filtering process is regarded as autonomous feature extraction with each convolutional filter bank corresponding to one feature map. Applying convolutional filters to generate the features greatly reduces the efforts for manual feature selection in traditional machine learning, and also provides translation invariance and parameter sharing. For the system included in the embodiment herein, the network learns through this feature extraction process to account for the signal-dependent media noise due to the underlying grain model.

In the first decoding pass of the CNN architecture for the DNN-APP detection system tested herein, the number of filter banks at convolutional stages #1 through 5 are chosen to be 128-64-32-16-8. In the second decoding pass herein, an extra convolutional stage #6 with 4 filter banks is added after convolutional stage #5. The network input herein consists of only three rows. For this reason, the number is decreased by a factor of 2 at each stage to enable the CNN to extract more salient features from the input stage and then gradually abstract only the part that is relevant to the output. Through the simulations herein, the per stage filter bank numbers are found to work well for the system in terms of classification accuracy, while maintaining a reasonable overall network complexity. The doubled input size and thus more information in the second decoding pass enables the second decoding pass to leverage more convolutional stages.

The convolutional layer is followed by a batch normalization layer to normalize the convolutional layer's output across a mini batch, i.e., $\hat{x}_i=(x_i-\mu_B)/\sqrt{\sigma_B^2+\in}$, $y_i=\gamma\hat{x}_i+\beta$, where $\mu_B$ is the mini-batch mean, $\sigma_B$ is the mini-batch standard deviation, $\in$ is the small denominator offset for numerical stability and $\beta$, $\gamma$ are learnable offset and scale factors that are optimized during the training. This normalization process speeds up the training, reduces the network's sensitivity to initialization and increases the network's stability. Similar to FCDNN, the last layer component in a convolutional stage is the ReLU layer which activates the network. The batch normalization layer and the ReLU layer do not change the size of their input. The output size of each convolutional stage is $3\times15\times N_f$, where $N_f$ is the number of filter banks at that convolutional stage. For the choice of $N_f$ herein, the dimensionality of the output at each convolutional stage is rather low and no max pooling layer is employed for down sampling. The last functional stage, i.e., the output stage of the CNN is identical to FCDNN. Overall, the learnable parameters of the CNN include the coefficients of the filter banks in the convolutional layers, the parameters in the batch normalization layers and the weights and biases in the fully connected layers in the output stage.

Figure 11:
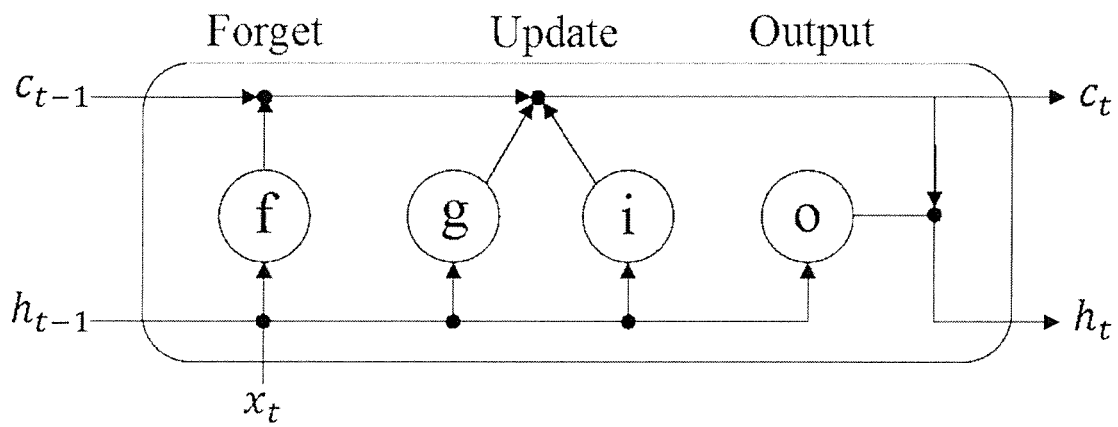
FIG. 11 shows the data flow inside the LSTM block cell at time step t.

For the embodiment herein, the LSTM architecture implemented for the DNN-APP detection system consists of an input stage, seven stacks of LSTM stages #1 through 7 and an output stage, with a total of 11 layers. The input stage for LSTM consists of a sequence input layer with a sequence size $N_{seq}=45$. This makes the input to LSTM the same as the input to the FCDNN herein. The input is interpreted as $N_{seq}$ time steps in a sequence. Each subsequent LSTM stage consists of a bidirectional LSTM (BLSTM) layer. Bidirectional dependencies are learned with the network's access to the complete sequence at each time step. Each BLSTM layer is made up of $N_{seq}$ repeating LSTM block cells, corresponding to the $N_{seq}$ time steps. At each BLSTM layer, information passes through each LSTM block cell sequentially. FIG. 11 illustrates the data flow inside a typical LSTM block cell at time step t, i.e., the $t^{th}$ LSTM block cell.

LSTM layers derive inter-time step relationships mainly through three type of gates including input gate denoted as i in FIG. 11, forget gate denoted as $f$ and output gate denoted as o. At a particular time step, the input gate allows the new input to pass through, the forget gate discards irrelevant information and the output gate allows the output to be updated. The three gates control the states at each time step, including the hidden state $h_t$, and the cell state $c_t$. The hidden state $h_t$ in the right corner of FIG. 11 contains the output of the LSTM block cell at time step t. This state stores information from previous time steps, which can be longer than the sequence length 45 justifying the name long short-term memory. The dimension of the hidden state $h_t$ is chosen as 100 for all of the seven BLSTM layers in the seven LSTM stages herein. The cell state $c_t$ is where memory from previous time steps is taken into consideration. At each time step, information is either added to $c_t$ through input gate or removed from $c_t$ through forget gate. The hyperbolic tangent function (tan h) is used as state activation function to update $c_t$ and $h_t$, and the sigmoid function $\sigma(x)=1/(1+\exp(-x))$ is used as the gate activation function to update the gates. LSTM stages #1 through 6 output the complete sequence having length 45 and the LSTM stage #7 outputs the last time step of the sequence. The output stage of the LSTM is identical to that of the FCDNN and CNN. The learnable parameters of the LSTM include the weights in the BLSTM layers, and the weights and biases in the fully connected layers in the output stage.

For the estimation of the three-track readings in the DNN-APP detection system, three DNNs with same structure are trained independently. This applies to each of the three DNN architectures investigated herein. In particular, the DNNs are trained with the following initializations: weights are initialized to be zero-mean Gaussian with a standard deviation of 0.01; biases and offsets are initialized to zero; scales are initialized to one. Further, adaptive moment estimation (Adam) optimizer is employed. Adam computes individual adaptive learning rates for different parameters from estimates of the first and second moments $m_l$ and $v_l$ of the gradient at the $l^{th}$ step. Adam is known by those of ordinary skill in the art, helps escape local saddle points and accelerate the training in the relevant direction.

In the simulations herein, Adam achieves a high accuracy at a faster rate as compared to the traditional optimizer stochastic gradient descent (SGD). The set of gradient update rules for each individual parameter for Adam is summarized as below, $$m_l = \beta_1 m_{l-1} + (1-\beta_1)\nabla E[\theta_l]$$
$$v_l = \beta_2 v_{l-1} + (1-\beta_2)(\nabla E[\theta_l])^2$$
$$\theta_{l+1} = \theta_l - \frac{\alpha m_l}{\sqrt{v_l}+\epsilon}$$

where, $\theta_l$ is the parameter value at step l, $\beta_1$, $\beta_2$ are the gradient decay factor and the squared gradient decay factor, $\alpha$ is the learning rate, $\in$ is a small offset. Values for hyperparameters $\beta_1$, $\beta_2$, $\alpha$, $\in$ are specified prior to the training. For the simulations herein, $\beta_1=0.95$, $\beta_2=0.99$, $\in=10^{-8}$ and the training rate $\alpha$ is piece-wise decaying with an initial value of 0.05. These values are used for all three DNN architectures. In CNN and FCDNN, $\alpha$ drops by a factor of 0.75 every epoch, i.e., one pass of the entire training data through the network. In LSTM, for track 2, $\alpha$ drops by a factor of 0.75 every epoch, and for tracks 1 and 3 it drops by the same factor every two epochs. Such learning rate scheduling is observed to yield best results through the simulations herein.

In the simulations herein, there are $N \approx 3\times 10^6$ training examples. It is computationally inefficient to pass all of them to the DNN at once to compute the gradient. The training data are divided into mini batches of size $N_{mb}=10^4$ and one mini batch is passed to the DNN at a time for computing the gradient. One such pass of a mini batch is called an iteration. The total number of iterations in an epoch results in $N/10^4$. In the simulations herein, the number of iterations is approximately 290. It has been observed through simulations that the choice of mini batch size works for the detection system herein based on a trade-off between computational efficiency and training accuracy (low BER). DNN is trained over a certain number of epochs $N_e$, which is roughly the smallest number of epochs required for the network to converge. For the simulations herein, for all three tracks, $N_e=15$ for FCDNN and CNN and $N_e=10$ for LSTM.

To evaluate the network as the training moves forward, the network is passed through a validation data set. This validation showcases how the trained network generalizes to previously unseen data. The training data and the validation data are randomly shuffled prior to the beginning of every epoch to reduce the effect of noise and generalize the learning. The possibility of early stopping based on validation results is explored for training a CNN used with iterative coding. The network input contains noise, leading to fluctuations in the training and validation accuracy. The fluctuations are observed every 50 iterations herein. In the training for the second decoding pass of CNN, validation is performed every epoch. The training is stopped when the validation loss does not decrease after three consecutive validations i.e., after three epochs.

In the simulations herein, it is observed that the CNN training for tracks 1, 2 and 3 in the second decoding pass auto-stopped after 11, 3 and 2 epochs respectively. This means that the track 1 requires the highest number of epochs to converge whereas track 3 requires the least. This could be a result for the shingled writing process in TDMR based HDDs. As shown in FIG. 1A, both tracks 1 and 3 are next to a boundary track. Tracks 3 abuts the fat track, track 4, whereas track 1 adjoins a fellow narrow track, track 0. In the system herein, the coded bits on tracks 0 and 4 known as boundary bits are passed to the DNN. Track 4 being a fat track, has a higher signal-to-noise ratio (SNR). This provided better help to the DNN in estimating track 3 than track 0 helping in estimating track 1.

In the linear PR equalizer described in FIG. 7, the PR mask and the filter coefficients are co-designed using the monic constraint and the upper and lower track outputs are produced using bits on the two boundary tracks. For the two GFP data sets generated to test the embodiment herein, the two designed PR masks are as below, $$\text{For } GFP \text{ data set \#1, } g = \begin{bmatrix} 0.0028 & 0.1623 & 0.1417 \\ 0.2795 & 1.0000 & 0.2903 \\ 0.2347 & 0.2684 & 0.0780 \end{bmatrix} \text{ and}$$

$$\text{For } GFP \text{ data set \#2, } g = \begin{bmatrix} 0.0080 & 0.0780 & 0.1097 \\ 0.2635 & 1.0000 & 0.2768 \\ 0.1965 & 0.1275 & 0.0267 \end{bmatrix}.$$

This pre-processing step equalizes cross-track ITI and down-track ISI to a window size approximately the same as the PR equalizer, i.e., 3×15 which further reduces the complexity of the subsequent DNN detector. The 3×3 PR target for the equalizer enables the CNN to better capture the local features or correlations in the equalized readings as the size of the filters used in all convolutional layers are 3×3.

The larger coefficients on the first and third row of the PR mask for GFP data set #1 imply higher ITI in GFP data set #1 than GFP data set #2.

It is observed from the simulations herein that CNN yields the lowest BER. CNN based detector is used for iterative decoding with the LDPC channel decoder. The CNN detector receives the filtered waveforms from the 2D linear PR equalizer and outputs soft estimates for all three tracks. The soft estimates are converted to LLRs, de-interleaved per track, and then fed into the channel decoder. This simulates the scenario that HDD data are first encoded and then interleaved. The purpose of interleaving and de-interleaving is to break correlation among the errors introduced by the detector, making the errors appear random to the channel decoder. Accordingly, the channel decoder's output LLRs are first interleaved and then sent to the CNN detector as a priori information for use in the next decoding pass.

For the second decoding pass, a separate CNN is trained and optimized which is tailored to the a priori information from the channel decoder. This piece of a priori information is shaped as part of the image input in a similar manner as the filtered waveforms. The input in the second iteration is a [3×15×2] array of two [3×15×1] images. The first image is a filtered waveform and the second image is the a priori information from the LDPC channel decoder. A linearly shifted version of the LDPC channel's estimated probabilities of each coded bit is passed to the CNN from the LDPC channel decoder in the detection system herein. It is observed from the simulations herein, that passing probabilities yields better performance than passing LLRs because the non-linearity of the log function introduces distortion. As probabilities are between 0 and 1, 0.5 is subtracted from them to make them zero mean before passing to the CNN. The CNN in the second iteration further lowers the BER and passes its output LLRs to the LDPC channel decoder again. The LDPC channel decoder produces the final decoded codeword at the end of the second iteration.

LLRs passed from the CNN to the channel decoder are multiplied by a weight factor w<1. This reduces the magnitudes of the CNN output LLR, avoiding the overestimation of CNN bit reliabilities. CNN's processing including the non-linear ReLU function makes it difficult to express the CNN's output LLRs as a sum of extrinsic and a priori terms. Hence, subtraction of the CNN's input LLRs received from the channel decoder from its output LLRs to form extrinsic information to pass to the channel decoder is not possible. It is observed in the simulations herein that w=0.5 results in the lowest decoded BER. Thresholds are applied on LLRs during iterations to avoid numerical issues.

Simulation Results

A Monte Carlo simulation was carried out for the DNN based APP detection system. The system is tested on two GFP data sets, both with TP=18 nm, BL=11 nm and GPB=3.5. The binary input bits in each block of these data sets are of size $5 \times N_b$, and the waveforms are $3 \times N_b$, where the track length $N_b=41,207$ for GFP data set #1, and $N_b=41,206$ for GFP data set #2. GFP data set #1 corresponds to the special sets of 512 training patterns. GFP data set #2 have shown simulation results of information density of 2.4 $Tb/in^2$ by employing a 3-input/1-output 2D linear PR equalizer with a 1D BCJR and LDPC channel decoder. In both GFP data sets, the boundary bits on the outer two input tracks are known. A total of a hundred blocks of input and waveform data are used. Seventy blocks are assigned as the training data set, ten blocks as the validation data set and the validation data set are available to the DNN during training. Simulation results below are for test data set.

A. Detector-Only BER Comparison

Figure 12:
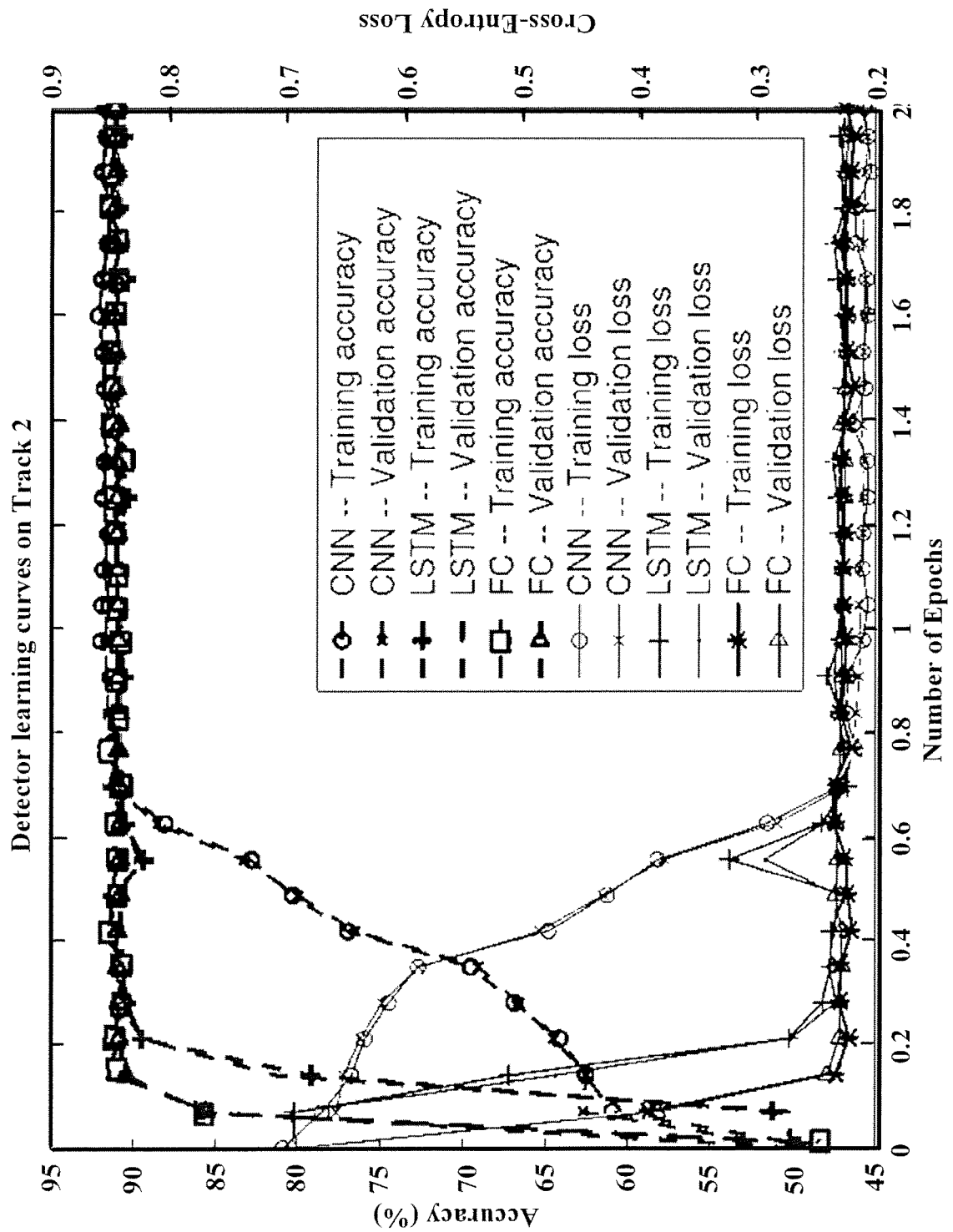
FIG. 12 illustrates training learning curves of FC-DNN, CNN and LSTM on track 2 of the DNN based APP detection system.

The three DNN architectures implemented in the first decoding pass are evaluated herein in terms of detector-only BER comparison. GFP data set #1 is used for this evaluation. FIG. 12 shows a portion of the training learning curves of the three DNN architectures on track 2. Accuracy is equal to 1-BER, which means the percentage of bits that are classified correctly. More than 90% accuracy is achieved within two epochs. During training, the FCDNN classifies the fastest among the three, followed by LSTM. The CNN initially makes the slowest classification but eventually achieves the highest accuracy. The initial convergence of the CNN is observed to be improved by fine tuning the hyperparameters in the optimizer used in the training process. The learning curves for tracks 1 and 3 are similar.

Table 5 below summarizes the simulation results for detector BER. The first row in the table shows the raw BERs on tracks 1, 2 and 3, which are obtained by applying a threshold of 0 on the readback signals before the equalizer. The second, third, and fourth rows show that the FCDNN, CNN and LSTM achieve average BERs (over all three tracks) of 8.03%, 7.75% and 8.28% respectively, thereby achieving BER reductions of 56.55%, 58.05% and 55.18% over the raw BER. These results show that the TDMR detection problem is more accurately characterized as an image processing problem than as a time series problem.

TABLE 5

Detector BER comparison

| TDMR Detectors | BER Track 1 | BER Track 2 | BER Track 3 | BER average |
|---|---|---|---|---|
| None | 18.54% | 18.53% | 18.33% | 18.47% |
| FCDNN | 8.30% | 8.21% | 7.56% | 8.03% |
| CNN | 7.99% | 7.87% | 7.38% | 7.75% |
| LSTM | 8.41% | 8.62% | 7.80% | 8.28% |
| 2D-PDNP | 10.60% | 12.48% | N/A | 11.54% |
| LAIP-BCJR | 8.99% | 7.69% | 8.88% | 8.52% |

In the fifth row in Table 5 above, the BER of a state-of-art 2D-PR 2D-BCJR/2D-PDNP two-track detection system is shown, where the 2D-PDNP two-track uses the 2D autoregressive model to predict media noise. Compared to the BCJR/2D-PDNP, the CNN detector achieves detector BER reductions of 24.62% and 36.94% on tracks 1 and 2, or an average BER reduction of 32.87%. The FCDNN and the LSTM detector gives average BER reductions of 30.47% and 28.27% separately. All of the three DNN detectors detect three tracks and this achieve a factor of 1.5× throughput gain.

In the sixth row in Table 5 above, the BER of a state-of-art 2D-PR LAIP-BCJR three-track detection system is shown, where the LAIP detector considers a 3×3 bit cell and assumes an additive model for read back value. Compared to the LAIP-BCJR detector, the CNN, FCDNN and LSTM detectors achieve average detector BER reductions of 9.07%, 5.83% and 2.85%.

B. Areal Density Comparison

Iterative coding is implemented between the CNN detector and the LDPC channel decoder. For the embodiment herein, the LLR thresholds $T_1$ and $T_2$ at the outputs of the CNN detector and the LDPC channel decoder are $T_1=10.0$ and $T_2=5.0$. Systematic IRA codes have been used. For the embodiment herein, the number of internal LDPC channel decoder iterations is 100 in the first decoding pass and 200 in the second decoding pass. For GFP data set #1, two decoding passes are done. For the GFP data set #2, one decoding pass is done. Results are reported in terms of both user bits per grain (U/G), where U/G=achieved-code-rate/GPB, and areal density, where areal density=U/G·Grain density. Achieved-code-rate is the highest code rate after puncturing that achieves a final decoded BER of $10^{-5}$. A puncturing scheme is used that accurately simulates puncturing bits written to an HDD. Puncturing is a standard technique used to raise the effective code rate of the channel code.

Table 6 below summarizes the simulation results of the DNN detection system with channel decoding. The raw channel BER is equal to that of the track detected for single-track detection, i.e., track 2, whereas it is the average BER over the three tracks detected for three-track detection, i.e., tracks 1, 2 and 3. When zero error counts are achieved, a conservative BER upper bound estimate is provided in parenthesis with a 95% confidence level. This BER upper bound is computed as $3/N_{tcb}$, where $N_{tcb}$ is the total number of transmitted coded bits. For GFP data set #1, with two passes of channel decoding, i.e., one loop between the CNN and the channel decoder, the DNN system achieves an average code rate of 0.6833 over the three detected tracks, which corresponds to 2.232 Terabits per square inch (Tb/in$^2$), equivalently 0.1957 U/G. The base rate of the IRA code used to produce this result is 0.6506. For GFP data set #2, with one single pass of channel decoding, the DNN system gives an average code rate of 0.9433, which corresponds to 3.081 Tb/in$^2$, or 0.2702 U/G. Surprisingly and unexpectedly, it was observed that this is the highest density ever reported on GFP model data with grain density of 11.4 Tg/in$^2$. The base rate of the IRA code used to produce this result is 0.7507. Higher base rate code result in further density gains with very little puncturing.

TABLE 6

Areal Density Comparison

| TDMR Detectors | GFP model | Raw channel BER | No. of tracks det. | Areal density (Tb/in$^2$) | User bits per grain | Code rate | Decoded BER | Decoded FER |
|---|---|---|---|---|---|---|---|---|
| 1D-PDNP 2 passes | GFP #1 | 0.1853 | 1 | 2.123 | 0.1862 | 0.6500 | 0 (1.9583e−6) | 0 (0.0500) |
| LAIP-BCJR 2 passes | GFP #1 | 0.1847 | 3 | 2.139 | 0.1876 | 0.6550 | 0 (3.7300e−7) | 0 (0.0100) |
| CNN 2 passes | GFP #1 | 0.1847 | 3 | 2.232 | 0.1957 | 0.6833 | 0 (1.8650e−6) | 0 (0.0500) |

TABLE 6-continued

Areal Density Comparison

| TDMR Detectors | GFP model | Raw channel BER | No. of tracks det. | Areal density (Tb/in$^2$) | User bits per grain | Code rate | Decoded BER | Decoded FER |
|---|---|---|---|---|---|---|---|---|
| 1D-PDNP 1 pass | GFP #2 | 0.1641 | 1 | 2.482 | 0.2177 | 0.7600 | 0 (1.2115e−6) | 0 (0.0375) |
| 1D-PDNP 2 passes | GFP #2 | 0.1641 | 1 | 2.531 | 0.2220 | 0.7750 | 0 (1.2115e−6) | 0 (0.0375) |
| 2D-PDNP 1 pass | GFP #2 | 0.1641 | 2 | 2.230 | 0.1957 | 0.6830 | 0 (6.8377e−06) | 0 (0.0250) |
| CNN 1 pass | GFP #2 | 0.1637 | 3 | 3.081 | 0.2702 | 0.9433 | 0 (1.6153e−6) | 0 (0.0500) |

Fifth row of the Table 6 above contains simulations results of a BCJR/2D-PDNP detector interfaced with LDPC channel decoder and sixth row of Table 6 contains the areal density result on the two tracks of this detector under a single decoding pass on GFP data set #2. For simulation result comparison, a standard 1D-PR 1D BJR/PDNP single track detection system is implemented based on a 1D autoregressive model.

Particularly, referring the fourth, sixth and last rows of Table 6, it is observed that 1D-PDNP gives 13.4% areal density gain over 2D-PDNP on GFP data set #2, whereas CNN gives 38.11% areal density gain, all under one decoding pass. 1D-PDNP considers a pattern of seven down-track bits, whereas 2D-PDNP only considers three bits on each of the two tracks in order to maintain a reasonable trellis state cardinality, resulting in 1D-PDNP having better performance than 2D-PDNP. However, 2D-PDNP doubles the data throughput compared to 1D-PDNP.

Furthermore, surprisingly and unexpectedly CNN based detection system with one decoding pass referenced in the last row of Table 6, achieves a 21.72% areal density gain over the 1D-PDNP turbo system with two decoding passes referenced in the fifth row of Table 6. The 1D-PDNP detection system is run for 20 iterations between the 1D-PDNP detector and the LDPC channel decoder, but is unable to take advantage of the turbo loops at a higher code rate. In contrast, CNNs are trained for only up to two decoding passes per iteration. With this it can be concluded that, further higher density can be achieved with more decoding passes. For GFP data set #1, the CNN based APP detection system referenced in the third row of Table 6 achieves a 5.12% areal density gain and three times throughput gain over 1D-PDNP referenced in the first row of Table 6 both with two decoding passes.

Second row of Table 6 shows areal density gain for a LAIP-BCJR detection system. One global pass, i.e., two channel decoder decoding passes are done for this system. The number of internal channel decoder iterations is 200 and 100 for the two channel decoders following the LAIP and the BCJR respectively. No inner loops between the LAIP and the first decoder or between the BCJR and the second LDPC channel decoder are done. LAIP is trained using the same model as GFP data set #1. The CNN result referenced in third row of Table 6 gives a 4.32% areal density gain over the LAIP-BCJR system.

C. Storage, Latency and Complexity Comparison

The conditional PMF tables stored by the LAIP require about 780 MB of offline overhead storage. The three FCDNNs require 0.18 MB for storing 49,518 learnable parameters, and the LSTM requires 17 MB for storing 4,686,006 learnable parameters for GFP data set #1. The three CNNs in each decoding pass together require approximately 1.2 MB for storing around 0.3 million learnable parameters. The 1D-PDNP requires 0.035 MB for storing 2,560 parameters. All the variables above are stored as double-precision floating-point values. The storage requirement for the LAIP-BCJR system is 325× that of the two-pass CNN system.

For the online detection time in the 1D-PDNP system, the latency due to one run of the 1D-PDNP detector is roughly 771.9 microseconds (μs) per bit. In the LAIP-BCJR system, the latency caused by one run of LAIP detector is approximately 766.4 μs/bit, and 281.3 μs/bit for one run of the 2D-BCJR. For the one global shot LAIP-BCJR system referenced in the second row of Table 6, the total latency caused by the LAIP and the 2D-BCJR detectors is 1047.7 μs/bit.

In the DNN based detection system, the three tracks are detected in parallel. The latency is around 12.8 μs/bit for the FCDNN architecture and 94.2 μs/bit for the LSTM architecture. The latency for CNN architecture ranges from 64.2 μs/bit to 79.5 μs/bit per decoding pass. The latency of CNN for one decoding pass referenced in the last row of Table 6 is approximately 1/10 the latency of one pass of the 1D-PDNP referenced in the fourth row of Table 6. The above results are estimated when all systems were run on the same CPU. When running on a GPU, the latency of CNN is reduced to the range between 12.1 μs/bit and 14.3 μs/bit, and the latency of LSTM becomes 43.2 μs/bit. It is an inherent advantage of DNNs to be capable to use GPU-enabled hardware for acceleration of training and real-time operation.

Referring to Table 7 below, it shows the computational complexity comparison (per bit) for four detectors. The 1D-PDNP looks at 1×7 bit patterns on track 2, and has 128 states. The 2D-PDNP considers 2×3 bit patterns on tracks 1 and 2, and has 64 states. The 2D-PDNP with 256 states gives 0.7% BER reduction on track 2 and 0.2% BER increase on track 1 as compared to the 2D-PDNP with 64 states.

TABLE 7

Computational complexity comparison

| Method | mul/div | add/sub | exp/log |
|---|---|---|---|
| 1D-PDNP | 137,985 | 106,746 | 257 |
| 2D-PDNP | 86,657 | 54,392 | 257 |
| LAIP-BCJR | 291,560 | 189,279 | 257 |
| CNN | 113,761 | 102,062 | 1 |

However, the complexity of the trellis based algorithms including the BCJR algorithm and the VA algorithm grows as the square of the number of states, and the 256-state 2D-PDNP requires more than 1 million multiplications. The 256 states of 2D-PDNP has minimal performance improvement in addition to the increased complexity. The results herein only include 64 states 2D-PDNP. For the LAIP-BCJR detector, more than 90% of the complexity is due to the 2D-BCJR. The number of states in the BCJR algorithm grows exponentially with the number of tracks being detected. This results in highest complexity for the LAIP-BCJR detecting three tracks. The LAIP detector is implemented in MATLAB resulting in large running time. The CNN is implemented using the deep learning toolbox in MATLAB. Table 7 shows that the CNN requires fewer operations than both the 1D-PDNP and the LAIP-BCJR. From this, it can be concluded that CNN has the least latency.

D. Boundary Conditions

Table 5 and Table 6 contain simulation results wherein the simulations assume perfect knowledge of the bits on the top and bottom boundary tracks. In a scenario where bits on both boundary tracks are unknown, the readback values are available. The boundary tack bits are estimated by making hard decisions on the boundary track readings. For the GFP data set #1, a raw BER is 18.5% for both boundary rows. In the 2D LAIP-BCJR detector, the unknown boundary tracks are estimated by pre-processing them with a simple 1D BCJR detector with four trellis states. Simulations with GFP data set #1 show that this pre-processing scheme reduces the boundary track BER to 7.6%. Random errors at introduced at a 7.6% BER into the boundary track data bits and the LAIP-BCJR detector is simulated with estimated boundary conditions. These simulations show that using the estimated boundaries reduces the LAIP-BCJR detector's areal density by about 7.0% compared to the perfect boundary case.

In a similar implementation for the DNN based APP detection system, a similar density penalty is achieved when boundary estimates are used. For GFP data set #1, the density penalty drops the achieved areal density of the LAIP-BCJR and the DNN based APP detectors slightly below that of 1D-PDNP detector which does not use adjacent track information. Further reduction of boundary track BER is achieved by using a single channel decoder pass on the boundary tracks, improving the DNN based APP detector's achieved areal density compared to the 1D-PDNP detector.

From the simulations herein, it is observed that for GFP data set #2, the lower raw BER of 16.4% results in lower boundary bit BERs after simple four state BCJR detection. This further reduces the areal density penalty due to unknown boundaries to <7%. With a 7% density loss, the DNN based APP detector with one channel decoding pass achieves a 13.2% density gain over the 1D-PDNP detector with two channel decoding passes on GFP data set #2.

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example(s) chosen for purposes of disclosure, and covers all changes and modifications which do not constitute departures from the true spirit and scope of this invention.

We claim:

1. A method of noise detection and prediction for a hard disk drive (HDD), comprising:
    receiving at an equalizer, a plurality of hard disk drive readings that correspond to one or more coded bits configured as a vector r, wherein the one or more coded bits configured as the vector r includes a plurality of samples $r^{(1)}$, $r^{(2)}$ up to $r^{(n)}$;
    detecting a partial response equalized filtered output $y^{(1)}$ resulting from the received sample $r^{(1)}$ at a trellis-detector; wherein an intersymbol interference resulting from the partial response equalized filtered output $y^{(1)}$ is reduced and wherein a first block of coded bit log-likelihood ratios ($LLR_b$) and a second block of coded bit log-likelihood ratios ($LLR_b$) are outputted;
    iteratively decoding one or more error correction codes embedded in the second block of log-likelihood ratios ($LLR_b$) so as to output a third block of log-likelihood ratios ($LLR_1$);
    receiving at a deep neural network noise predictor, the first block of coded bit log-likelihood ratios ($LLR_b$), the partial response equalized filtered output $y^{(1)}$, the third block of log-likelihood ratios ($LLR_1$), and the one or more samples $r^{(2)}$ up to $r^{(n)}$, wherein the deep neural network noise predictor is configured to predict a media noise term of the partial response equalized filtered output $y^{(1)}$, and wherein the one or more samples $r^{(2)}$ up to $r^{(n)}$, the first block of coded bit log-likelihood ratios ($LLR_b$) and the iteratively decoded second block of log-likelihood ratios ($LLR_1$) improves estimation of the media noise and reduces a bit error rate (BER); and
    turbo equalizing through iteratively exchanging between the trellis-detector, the deep neural network noise predictor and a channel decoder in multiple passes so as to provide an improved media noise estimate $ñ_m$ of the media noise, and wherein the trellis detector is configured to cancel the media noise after multiple iterations upon a converged bit error rate (BER).

2. The method of noise detection and prediction of claim 1, wherein the one or more coded bits configured as the vector r comprises a one-dimensional magnetic recording (1DMR) format or a two-dimensional magnetic recording (TDMR) format.

3. The method of noise detection and prediction of claim 1, wherein the detecting step includes a Bahl-Cocke-Jelinek-Raviv (BCJR) trellis-detector or a soft-output Viterbi (SOYA) trellis-detector.

4. The method of noise detection and prediction of claim 3, wherein the iteratively decoding step further comprises iteratively decoding using the Bahl-Cocke-Jelinek-Raviv (BCJR) trellis-detector.

5. The method of noise detection and prediction of claim 4, wherein at least a second iteration using the Bahl-Cocke-Jelinek-Raviv (BCJR) trellis-detector sends an improved LLR vector estimate $LLR_b$ to the channel decoder.

6. The method of noise detection and prediction of claim 3, wherein the iterating step further comprises a one-loop decoding step using the soft-output Viterbi (SOVA) trellis-detector.

7. The method of noise detection and prediction of claim 1, wherein the intersymbol interference in the detecting step further comprises: reducing at least one of: a down track intersymbol interference and a cross track intersymbol interference.

8. The method of noise detection and prediction of claim 1, wherein the deep neural network noise predictor is configured to receive a plurality of stacked input layers such that a plurality of 2D convolutional filters are configured to be employed with the deep neural network noise predictor in a one-dimensional-magnetic recording (1DMR) format, and wherein a plurality of 3D convolution filters are configured to be employed with the deep neural network noise predictor in a two-dimensional-magnetic recording (TDMR).

9. A noise detection and prediction system for a hard disk drive (HDD), comprising:
- a plurality of hard disk drive readings that correspond to one or more coded bits configured as a vector r, wherein the one or more coded bits configured as the vector r includes a plurality of samples $r^{(1)}$, $r^{(2)}$ up to $r^{(n)}$;
- a trellis-detector configured to receive a partial response equalized filtered output $y^{(1)}$ resulting from a received sample $r^{(1)}$, wherein a intersymbol interference resulting from the partial response equalized filtered output $y^{(1)}$ is reduced, and wherein a first block of coded bit log-likelihood ratios ($LLR_b$) and a second block of coded bit log-likelihood ratios ($LLR_b$) are outputted from the trellis detector;
- a channel decoder configured to decode one or more error correction codes embedded in the second block of log-likelihood ratios ($LLR_b$) so as to output a third block of log-likelihood ratios ($LLR_1$); and
- a deep neural network noise predictor configured to receive the first block of coded bit log-likelihood ratios (LLRb), the partial response equalized filtered output $y^{(1)}$, the third block of log-likelihood ratios ($LLR_1$); and one or more samples $r^{(2)}$ up to $r^{(n)}$, wherein the deep neural network noise predictor is configured to predict a media noise term within the partial response equalized filtered output $y^{(1)}$, and wherein the one or more samples $r^{(2)}$ up to $r^{(n)}$, the first block of coded bit log-likelihood ratios ($LLR_b$) and the iteratively decoded third block of log-likelihood ratios ($LLR_1$) improves estimation of the media noise and reduces a bit error rate (BER).

10. The noise detection and prediction system for a hard disk drive (HDD) of claim 9, wherein the trellis-detector is configured as a Bahl-Cocke-Jelinek-Raviv (BCJR) trellis-detector or a soft-output Viterbi (SOVA) trellis-detector.

11. The noise detection and prediction system for a hard disk drive (HDD) of claim 10, wherein the Bahl-Cocke-Jelinek-Raviv (BCJR) trellis-detector is configured to receive an iteratively decoded block of log-likelihood ratios ($LLR_1$).

12. The noise detection and prediction system for a hard disk drive (HDD) of claim 10, wherein the soft-output Viterbi (SOYA) trellis-detector is configured to receive a one-loop decoded iteration block of log-likelihood ratios ($LLR_1$).

13. The noise detection and prediction system for a hard disk drive (HDD) of claim 9, wherein the trellis-detector is configured to reduce the intersymbol interference, wherein the intersymbol interference is at least one of: a down track intersymbol interference and a cross track intersymbol interference.

14. The noise detection and prediction system for a hard disk drive (HDD) of claim 9, wherein the noise detection and prediction system for a hard disk drive (HDD) is configured to receive the plurality of samples $r^{(1)}$, $r^{(2)}$ up to $r^{(n)}$ in a one-dimensional magnetic recording (1DMR) format or a two-dimensional magnetic recording (TDMR) format.

15. The noise detection and prediction system for a hard disk drive (HDD) of claim 14, wherein the deep neural network noise predictor operates for all of a plurality of configured tracks on a hard disk drive in the two-dimensional magnetic recording (TDMR) format.

16. The noise detection and prediction system for a hard disk drive (HDD) of claim 14, wherein the deep neural network noise predictor operates for each of the plurality of configured tracks on a hard disk drive in the two-dimensional magnetic recording (TDMR) format.

17. The noise detection and prediction system for a hard disk drive (HDD) of claim 9, further comprising:
- a partial response mask arranged as a sampled finite impulse response filter to configure a down track intersymbol interference as a shortened effective intersymbol interference of one or more data bits of odd samples $r^{(1)}$ from the hard disk drive.

18. The noise detection and prediction system for a hard disk drive (HDD) of claim 17, wherein the partial response mask is configured to utilize a unit energy (UE) constraint and a monic constraint.

19. The noise detection and prediction system for a hard disk drive (HDD) of claim 17, further comprising:
- an equalizer configured to minimize a mean squared error between the equalizer output and a convolution of a one or multiple coded data bits written on the hard disk drive with the partial response mask of a partial response target.

20. The noise detection and prediction system for a hard disk drive (HDD) of claim 19, wherein the equalizer is a linear equalizer or a non-linear equalizer.

21. The noise detection and prediction system for a hard disk drive (HDD) of claim 9, wherein the channel decoder is configured as a low-density parity check (LDPC) error channel decoder.

22. The noise detection and prediction system for a hard disk drive (HDD) of claim 9, wherein the deep neural network noise predictor is configured as a deep neural network comprising a fully connected deep neural network (FCDNN), a convolutional neural network (CNN), or a long short-term memory (LSTM).

23. A noise detection and prediction system for a hard disk drive (HDD), comprising:
- a deep neural network a posteriori probability (APP) detector, wherein the deep neural network a posteriori probability (APP) detector is configured to predict and cancel a media noise, a down track intersymbol interference and an intertrack interference;
- a partial response equalizer is configured to reduce a size of the down track intersymbol interference and the intertrack interference further reducing a complexity of the deep neural network a posteriori probability (APP) detector;
- and a decoder configured to iteratively exchange one or more log-likelihood ratios (LLRs) of one or more coded bits with the deep neural network a posteriori probability (APP) detector.

* * * * *